(12) United States Patent
Kim

(10) Patent No.: US 11,900,838 B2
(45) Date of Patent: Feb. 13, 2024

(54) TILED DISPLAY DEVICE

(71) Applicant: SAMSUNG DISPLAY CO., LTD., Yongin-si (KR)

(72) Inventor: Duk Sung Kim, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/157,805

(22) Filed: Jan. 20, 2023

(65) Prior Publication Data

US 2023/0162629 A1 May 25, 2023

Related U.S. Application Data

(63) Continuation of application No. 17/125,756, filed on Dec. 17, 2020, now Pat. No. 11,562,669.

(30) Foreign Application Priority Data

Apr. 13, 2020 (KR) .................. 10-2020-0044489

(51) Int. Cl.
*G09F 9/302* (2006.01)
*G09F 9/33* (2006.01)
(Continued)

(52) U.S. Cl.
CPC ............. *G09F 9/3026* (2013.01); *G09F 9/33* (2013.01); *H01L 33/38* (2013.01); *H01L 33/502* (2013.01);
(Continued)

(58) Field of Classification Search
CPC ............. H01L 25/162; H01L 25/0753; H01L 25/0756; H01L 25/167; H01L 33/502;
(Continued)

(56) References Cited

U.S. PATENT DOCUMENTS

2002/0140629 A1* 10/2002 Sundahl ............ G02F 1/13336
345/1.3
2018/0151539 A1 5/2018 Nakamura et al.
(Continued)

FOREIGN PATENT DOCUMENTS

JP 4729754 B2 7/2011
JP 4934920 B2 5/2012
(Continued)

*Primary Examiner* — Nitin Patel
*Assistant Examiner* — Amen W Bogale
(74) *Attorney, Agent, or Firm* — Lewis Roca Rothgerber Christie LLP

(57) ABSTRACT

A tiled display device includes a first display substrate including a plurality of light emitting areas defined by one or more banks, a second display substrate adjacent to the first display substrate and including a plurality of light emitting areas, a coupling member coupling the first display substrate and the second display substrate, and a color conversion substrate including a plurality of light transmitting areas corresponding to the plurality of light emitting areas of each of the first display substrate and the second display substrate, and a plurality of light blocking areas between the plurality of light transmitting areas and corresponding to the one or more banks or the coupling member.

18 Claims, 14 Drawing Sheets

(51) Int. Cl.
*H01L 33/62* (2010.01)
*H01L 33/58* (2010.01)
*H01L 33/38* (2010.01)
*H01L 33/50* (2010.01)
*H01L 33/54* (2010.01)

(52) U.S. Cl.
CPC .............. *H01L 33/54* (2013.01); *H01L 33/58* (2013.01); *H01L 33/62* (2013.01)

(58) Field of Classification Search
CPC ....... H01L 33/58; H01L 33/60; H01L 33/483; H01L 33/486; H01L 33/50; H01L 33/504; H01L 33/38; H01L 33/62; H01L 33/54; H01L 27/1248; H01L 27/124; G09G 2300/0426; G09G 2300/026; G09G 2300/023; G09G 2300/02; G09F 9/3026; G09F 9/3023; G09F 9/33; G06F 3/1446; H05K 1/144; H05K 1/189; H05K 2201/049; H05K 2201/05; H05K 5/0018; H05K 5/0017; H05K 5/0021; G02F 1/13452; G02F 1/13336; G02F 1/133512; G02F 2/136209; H10K 59/131; H10K 59/12; H10K 59/18; H10K 39/10; H10K 39/12; H10K 39/15; H10K 39/18; H10K 39/601; H10K 39/621; H10K 59/95; H10K 59/90; H10B 80/00; H10N 19/00; H10N 39/00; H10N 59/00; H10N 69/00; H10N 79/00; H10N 89/00
See application file for complete search history.

(56) References Cited

U.S. PATENT DOCUMENTS

| | | | |
|---|---|---|---|
| 2018/0190631 A1* | 7/2018 | Kim | ..................... G06F 3/1446 |
| 2018/0190747 A1 | 7/2018 | Son et al. | |
| 2019/0305073 A1 | 10/2019 | Chen et al. | |
| 2020/0052033 A1* | 2/2020 | Iguchi | ................... H01L 27/156 |
| 2021/0193790 A1 | 6/2021 | Hu et al. | |
| 2021/0280662 A1 | 9/2021 | Kim et al. | |
| 2022/0052240 A1 | 2/2022 | Jang et al. | |

FOREIGN PATENT DOCUMENTS

| | | |
|---|---|---|
| KR | 10-2018-0079080 A | 7/2018 |
| KR | 10-2021-0113478 A | 9/2021 |

* cited by examiner

TILED DISPLAY DEVICE

CROSS-REFERENCE TO RELATED APPLICATIONS

This application is a continuation of U.S. patent application Ser. No. 17/125,756, filed Dec. 17, 2020, which claims priority to and the benefit of Korean Patent Application No. 10-2020-0044489, filed Apr. 13, 2020, the entire content of both of which is incorporated herein by reference.

BACKGROUND

1. Field

The present disclosure relates to a tiled display device.

2. Description of the Related Art

With the development of information society, requirements for display devices for displaying images have increased in various forms. For example, display devices are applied to various electronic appliances such as smart phones, digital cameras, notebook computers, navigators, and smart televisions. A display device may be a flat panel display device, such as, a liquid crystal display device, a field emission display device, or a light emitting display device. Because a light emitting display device, among flat panel display devices, includes light emitting elements by which each of the pixels in a display panel emits light by itself, it may display an image without a backlight unit for providing light to the display panel.

When a display device is manufactured in a large size, the defective rate of light emitting elements may increase due to an increase in the number of pixels, and productivity or reliability may deteriorate. In order to solve the above problem, a tiled display device may implement a large-sized screen by connecting a plurality of display devices having relatively small sizes. The tiled display device may include a boundary portion called a seam between the plurality of display devices due to the non-display area or bezel area of each of the plurality of display devices that are adjacent to each other. When a single image is displayed on the entire screen, the boundary portion between the plurality of display devices may have an appearance of a disconnection on the entire screen, thereby reducing the degree of immersion into the image.

SUMMARY

Aspects of the present disclosure are to provide a tiled display device capable of removing the appearance of disconnection between a plurality of display devices and improving the degree of immersion into an image by preventing or substantially preventing a boundary portion or non-display area between the plurality of display devices from being visually recognized.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to one or more example embodiments of the present disclosure, a tiled display device includes: a first display substrate including a plurality of light emitting areas defined by one or more banks, a second display substrate adjacent to the first display substrate and including a plurality of light emitting areas, a coupling member coupling the first display substrate and the second display substrate, and a color conversion substrate including a plurality of light transmitting areas corresponding to the plurality of light emitting areas of each of the first display substrate and the second display substrate, and a plurality of light blocking areas between the plurality of light transmitting areas and corresponding to the one or more banks or the coupling member.

The first display substrate may include: a connection pad on a side surface of the first display substrate and located between the first display substrate and the second display substrate, and a flexible film on one surface of the connection pad and extending from the side surface of the first display substrate to a lower surface of the first display substrate.

The connection pad and the flexible film may overlap one of the plurality of light blocking areas in a thickness direction.

The first display substrate may further include at least one thin film transistor and a connection line located at a same layer as at least one of a drain electrode, a source electrode and a gate electrode of the thin film transistor, and the connection line may be electrically connected to the flexible film through the connection pad.

Each of the first display substrate and the second display substrate may include: a thin film transistor layer including at least one thin film transistor, a first electrode overlapping one of the plurality of light emitting areas on the thin film transistor layer, a second electrode overlapping one of the plurality of light emitting areas on the thin film transistor layer and spaced from the first electrode, and a light emitting element located between the first electrode and the second electrode to emit light.

Each of the first display substrate and the second display substrate may further include: a passivation layer covering the first electrode, the second electrode, the light emitting element, and the one or more banks.

The coupling member may couple a side surface of the passivation layer of the first display substrate and a side surface of the passivation layer of the second display substrate.

The color conversion substrate may include: a base member including the plurality of light transmitting areas and the plurality of light blocking areas, a plurality of wavelength conversion units on the base member to correspond to one or more of the plurality of light transmitting areas, and a light transmission unit on the base member to correspond to other ones of the plurality of light transmitting areas.

The color conversion substrate may further include a capping layer covering the plurality of wavelength conversion units and the light transmission unit, and the tiled display device may further include a filler between the passivation layer and the capping layer.

The plurality of wavelength conversion units may include: a first wavelength conversion unit including a first wavelength shifter to convert a peak wavelength of incident light to a first peak wavelength, and a light scattering material, and a second wavelength conversion unit including a second wavelength shifter to convert a peak wavelength of incident light to a second peak wavelength different from the first peak wavelength, and the light scattering material.

The light transmission unit may maintain a peak wavelength of incident light using a light scattering material to transmit the incident light.

The first display substrate may include: a first base member, a thin film transistor layer on the first base member and including at least one thin film transistor, a connection line between the plurality of light emitting areas in the thin film transistor layer, and a pad unit on a lower surface of the first base member and connected to the connection line through a contact hole penetrating the first base member.

The connection line may include a same material at a same layer as at least one of a drain electrode, a source electrode, and a gate electrode of the thin film transistor.

The connection line may be connected to the pad unit through a contact hole penetrating at least a part of the thin film transistor layer.

The connection line may overlap the one or more banks and a light blocking area corresponding to the one or more banks in a thickness direction.

The pad unit may overlap the connection line, a bank corresponding to the connection line from among the one or more banks, and a light blocking layer corresponding to the bank in a thickness direction.

The first display substrate may include: a display area including the plurality of light emitting areas, a non-display area surrounding the display area, and a pad unit at one side of the non-display area. The pad unit may overlap at least one light emitting area of the second display substrate.

The first display substrate may further include: a flexible film connected to the pad unit through an adhesive film, and a source driver located on the flexible film. The flexible film and the source driver may overlap the at least one light emitting area of the second display substrate.

The first display substrate may be a flexible substrate, the non-display area in which the pad unit may be located extends from one side of the display area of the first display substrate to a lower portion of the second display substrate.

The coupling member may couple an upper surface of the non-display area of the first display substrate and a side surface of the second display substrate.

According to one or more embodiments, a tiled display device includes a color conversion substrate including a plurality of light transmitting areas corresponding to the plurality of light emitting areas of each of a plurality of display substrates, and a plurality of light blocking areas between the plurality of light transmitting areas and corresponding to the one or more banks defining the plurality of light emitting areas or the coupling member coupling the plurality of display substrates. Therefore, the tiled display device may remove the appearance of disconnection between the plurality of display devices and improve the degree of immersion into an image by preventing or substantially preventing the boundary portion or the non-display area between the plurality of display devices from being visually recognized.

The effects of embodiments according to the present disclosure are not limited by the foregoing, and other various effects may be included in or realized by one or more embodiments according to the present disclosure.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION

Figure 1:
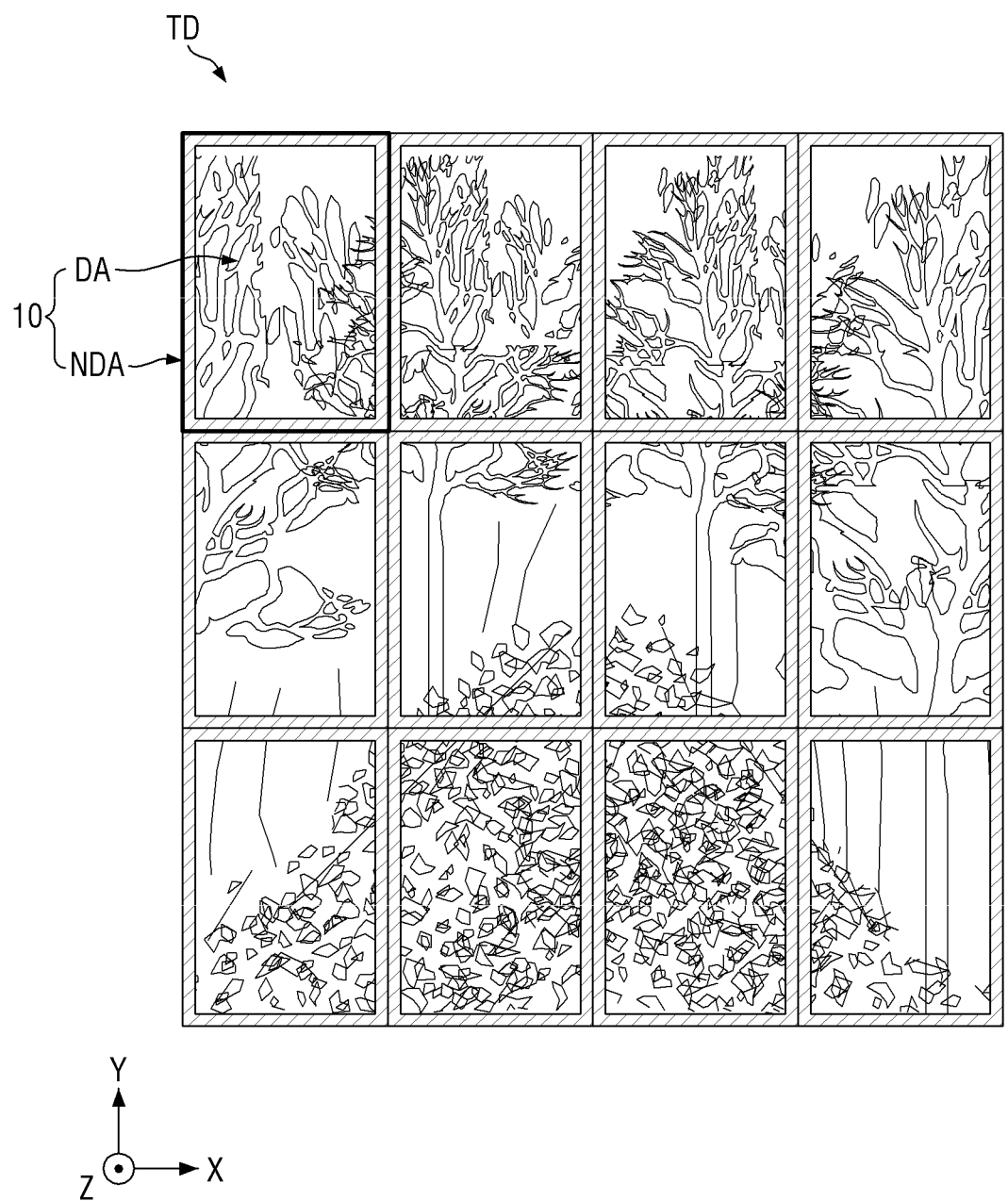
FIG. 1 is a plan view of a tiled display device according to one or more example embodiments.

In the following description, for the purposes of explanation, numerous specific details are set forth in order to provide a thorough understanding of various example embodiments or implementations of the disclosure. As used herein "embodiments" and "implementations" are interchangeable words that are non-limiting examples of devices or methods employing one or more of the inventive concepts disclosed herein. It is apparent, however, that various example embodiments may be practiced without these specific details or with one or more equivalent arrangements. In other instances, well-known structures and devices are shown in block diagram form in order to avoid unnecessarily obscuring various example embodiments. Further, various example embodiments may be different, but do not have to be exclusive. For example, specific shapes, configurations, and characteristics of an example embodiment may be used or implemented in another example embodiment without departing from the inventive concepts.

Unless otherwise specified, the illustrated example embodiments are to be understood as providing example features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an example embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the example term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various example embodiments are described herein with reference to sectional and/or exploded illustrations that are schematic illustrations of idealized example embodiments and/or intermediate structures. As such, variations from the shapes of the illustrations as a result, for example, of manufacturing techniques and/or tolerances, are to be expected. Thus, example embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some example embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some example embodiments may be physically separated into two or more interacting and discrete blocks, units, and/or modules without departing from the scope of the inventive concepts. Further, the blocks, units, and/or modules of some example embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a plan view of a tiled display device according to one or more example embodiments.

Referring to FIG. 1, a tiled display device TD may include a plurality of display devices 10. The plurality of display devices 10 may be arranged in a grid (or a matrix) shape, but the present disclosure is not limited thereto. The plurality of display devices 10 may be connected in a first direction (X-axis direction) and/or a second direction (Y-axis direction), and the tiled display device TD may have a specific shape. For example, each of the plurality of display devices 10 may have the same size as each other, but the present disclosure is not limited thereto. In another example, the plurality of display devices 10 may have different sizes from each other.

Each of the plurality of display devices 10 may have a rectangular shape including long sides and short sides. The plurality of display devices 10 may be arranged with long sides and/or short sides connected to each other. Some display devices 10 may be disposed at corners of the tiled display device TD to form two adjacent sides of the tiled display device TD. Some other display devices 10 may be disposed at or arranged along the edge of the tiled display device TD to form one side of the tiled display device TD. Another display device 10 may be disposed at the inside portion the tiled display device TD to be surrounded by other display devices 10.

Each of the plurality of display devices 10 may include a display area DA and a non-display area NDA. The display area DA may include a plurality of pixels to display an image. The non-display area NDA may be disposed around the display area DA to surround the display area DA, and may not display an image.

The tiled display device TD may have a planar shape as a whole, but the present disclosure is not limited thereto. The tiled display device TD may have a three-dimensional shape, thereby providing a three-dimensional effect to a user. For example, when the tiled display device TD has a three-dimensional shape, at least some of the plurality of display devices 10 may have a curved shape. In another example, the plurality of display devices 10 have a planar shape and area connected to each other at an angle (e.g., a set angle or a predetermined angle), so that the tiled display device TD may have a three-dimensional shape.

The tiled display device TD may be formed by connecting the non-display areas NDA of the adjacent display devices 10. The plurality of display devices 10 may be connected to each other through a connection member or an adhesive member. Accordingly, the non-display area NDA between the plurality of display devices 10 may be surrounded by the adjacent display areas DA. The external light reflectance of the display area DA of each of the plurality of display devices 10 may be substantially the same as the external light reflectance of the non-display area NDA between the plurality of display devices 10. Here, the significance of a phenomenon or a characteristic that the external light reflectance of the display area DA is substantially the same as the external light reflectance of the non-display area NDA is that the non-display area NDA between the plurality of display devices 10 or the boundary portion between the plurality of display devices 10 is not visually recognized by the user. Accordingly, the tiled display device TD may remove the appearance of disconnection between the plurality of display devices and improve the degree of immersion into an image by preventing or substantially preventing the boundary portion or the non-display area between the plurality of display devices from being visually recognized.

Figure 2:
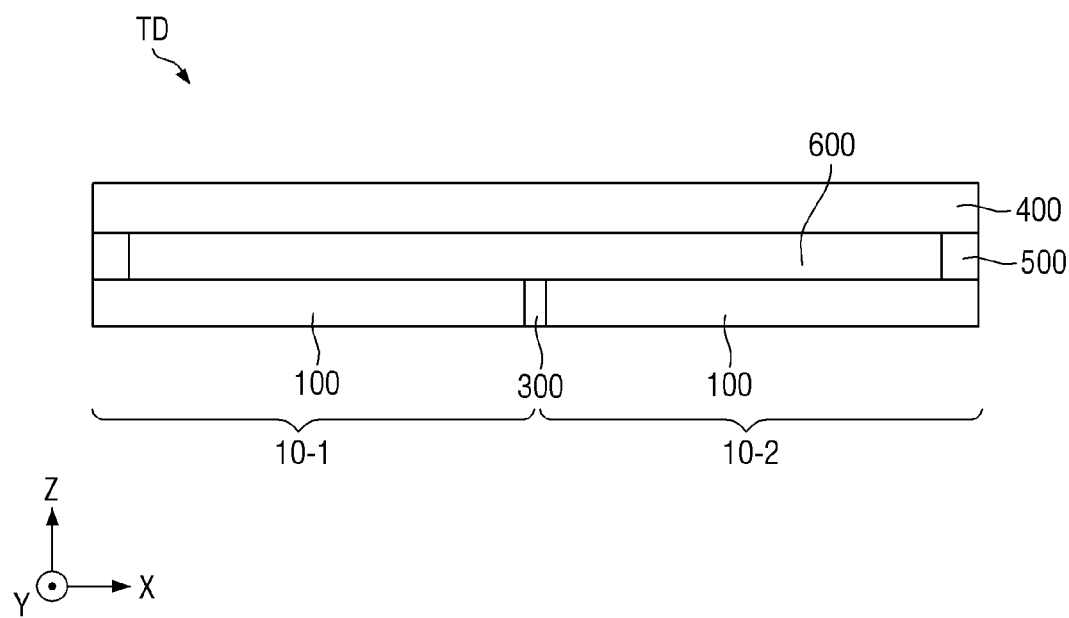
FIG. 2 is a cross-sectional view of a tiled display device according to one or more example embodiments.

FIG. 2 is a cross-sectional view of a tiled display device according to one or more example embodiments.

Referring to FIG. 2, the tiled display device TD may include a plurality of display devices 10. The tiled display device TD may include a plurality of display substrates 100, a color conversion substrate 400, a sealing member 500, and a filler 600. Each of the plurality of display substrates 100 may correspond to each of the plurality of display devices 10. For example, the tiled display device TD may include first and second display devices 10-1 and 10-2. Each of the first and second display devices 10-1 and 10-2 may include a corresponding display substrate 100, and the first and second display devices 10-1 and 10-2 may share one color conversion substrate 400.

The display substrate 100 may emit light having a peak wavelength (e.g., a set peak wavelength or a predetermined peak wavelength) from a plurality of light emitting areas of the display area DA. The display substrate 100 may include elements and circuits for displaying an image. For example, the display substrate 100 may include a pixel circuit such as a switching element, a pixel defining layer defining light emitting areas of the display area DA, and a self-light emitting element.

For example, the self-light emitting element may include at least one of an organic light emitting diode, a quantum dot light emitting diode, and an inorganic material-based light emitting diode (for example, a quantum dot LED). For example, the inorganic material-based light-emitting diode may have a size in micro or nano scale.

Hereinafter, a case where the self-light emitting element is an inorganic material-based light emitting diode will be described as an example.

For example, referring to FIG. 2, a coupling member 300 is disposed between the display substrates 100 to couple the side surfaces of the adjacent display substrates 100 to each other. The coupling member 300 may implement the tiled display device TD by connecting the side surfaces of the plurality of display devices 10 arranged in a grid shape. For example, the coupling member 300 may be formed as an adhesive or double-sided tape having a relatively thin thickness, thereby reducing or minimizing a gap between the plurality of display devices 10. In another example, the coupling member 300 may be formed as a coupling frame having a relatively thin thickness, thereby reducing or minimizing a gap between the plurality of display devices 10.

For example, the coupling member 300 may further include a filling member capable of preventing or substantially preventing an air gap from being present between the plurality of display substrates 100 after the plurality of display substrates 100 are coupled to each other. The filling member may supplement a bonding force between the plurality of display substrates 100 and may prevent impurities, such as, moisture or air from penetrating into the tiled display device TD.

The color conversion substrate 400 may be disposed on the plurality of display substrates 100, and may face the plurality of display substrates 100. The color conversion substrate 400 may include a plurality of light transmitting areas corresponding to the plurality of light emitting areas of each of the plurality of display substrates 100. The color conversion substrate 400 may convert a peak wavelength of light emitted from the light emitting areas of the display substrate 100 to transmit the light, or may maintain a peak wavelength of light emitted from the light emitting areas of the display substrate 100 to transmit the light. For example, the display substrate 100 may emit light having a peak wavelength (a set peak wavelength or a predetermined peak wavelength), and the color conversion substrate 400 may transmit at least two or more lights having different peak wavelengths.

The sealing member 500 may be interposed between the edge of the display substrate 100 of the outermost display device 10 from among the plurality of display devices 10 and the edge of the color conversion substrate 400. The sealing member 500 may be disposed along the edge of the tiled display device TD between the color conversion substrate 400 and the plurality of display substrates 100. The sealing member 500 may be disposed along the non-display area NDA of the display substrate 100 to seal the filler 600. The plurality of display substrates 100 and the color conversion substrate 400 may be coupled to each other through the sealing member 500 and the filler 600. For example, the sealing member 500 may include an organic material. The sealing member 500 may be made of an epoxy resin, but the material thereof is not limited thereto.

The filler 600 may be provided in a space between the plurality of display substrates 100 and the color conversion substrate 400, and may be surrounded by the sealing member 500. The filler 600 may fill the space between the plurality of display substrates 100 and the color conversion substrate 400. For example, the filler 600 may be made of an organic material and may transmit light. The filler 600 may be made of a silicon-based organic material, an epoxy-based organic material, etc., but the material thereof is not limited thereto. The filler 600 may have an adhesive force, and may fix the plurality of display substrates 100 and the color conversion substrates 400 to each other.

Figure 3:
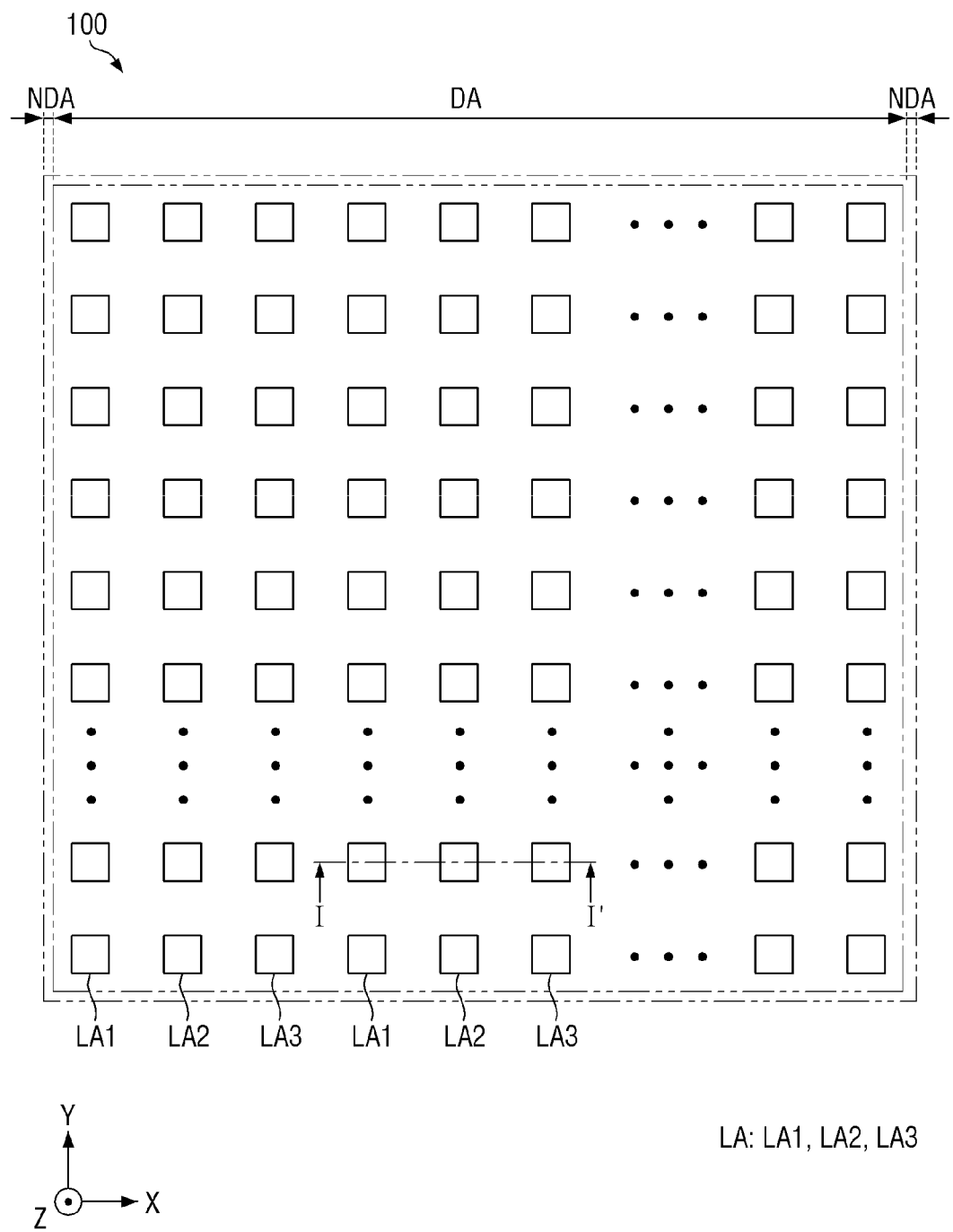
FIG. 3 is a plan view illustrating a display substrate of a display device according to one or more example embodiments.

FIG. 3 is a plan view illustrating a display substrate of a display device according to one or more example embodiments.

Referring to FIG. 3, the display substrate 100 may include a plurality of pixels arranged in the display area DA in a plurality of rows and columns. Each of the plurality of pixels may include a light emitting area defined by the pixel defining layer, and may emit light having a peak wavelength (e.g., a set peak wavelength or a predetermined peak wavelength) through the light emitting area. For example, the display area DA of the display substrate 100 may include first to third light emitting areas LA1, LA2, and LA3. Each of the first to third light emitting areas LA1, LA2, and LA3 may be an area in which light generated by the light emitting element of the display substrate 100 is emitted to the outside of the display substrate 100.

The first to third light emitting areas LA1, LA2, and LA3 may emit light having a peak wavelength (e.g., a set peak wavelength or a predetermined peak wavelength) to the outside of the display substrate 100. For example, the first to third light emitting areas LA1, LA2, and LA3 may emit blue light. The light emitted from the first to third light emitting areas LA1, LA2, and LA3 may have a peak wavelength ranging from 440 nm to 480 nm.

The first to third light emitting areas LA1, LA2, and LA3 may be repeatedly arranged sequentially along the first direction (X-axis direction) of the display area DA. For example, the width of the first light emitting area LA1 in the first direction (X-axis direction) may be greater than the width of the second light emitting area LA2 in the first direction, and the width of the second light emitting area LA2 in the first direction (X-axis direction) may be greater than the width of the third light emitting area LA3 in the first direction (X-axis direction). The width of each of the first to third light emitting areas LA1, LA2, and LA3 is not limited to the embodiment illustrated in FIG. 3. For example, in some other embodiments, the width of the first light emitting area LA1 in the first direction (X-axis direction), the width of the second light emitting area LA2 in the first direction (X-axis direction), and the width of the third light emitting area LA3 in the first direction (X-axis direction) may be substantially the same as each other.

For example, the area of the first light emitting area LA1 may be larger than the area of the second light emitting area LA2, and the area of the second light emitting area LA2 may be larger than the area of the third light emitting area LA3. The area of each of the first to third light emitting area s LA1, LA2, and LA3 is not limited to the embodiment illustrated in FIG. 3. In another example, the area of the first light emitting area LA1, the area of the second light emitting area LA2, and the area of the third light emitting area LA3 may be substantially equal to each other.

Figure 4:
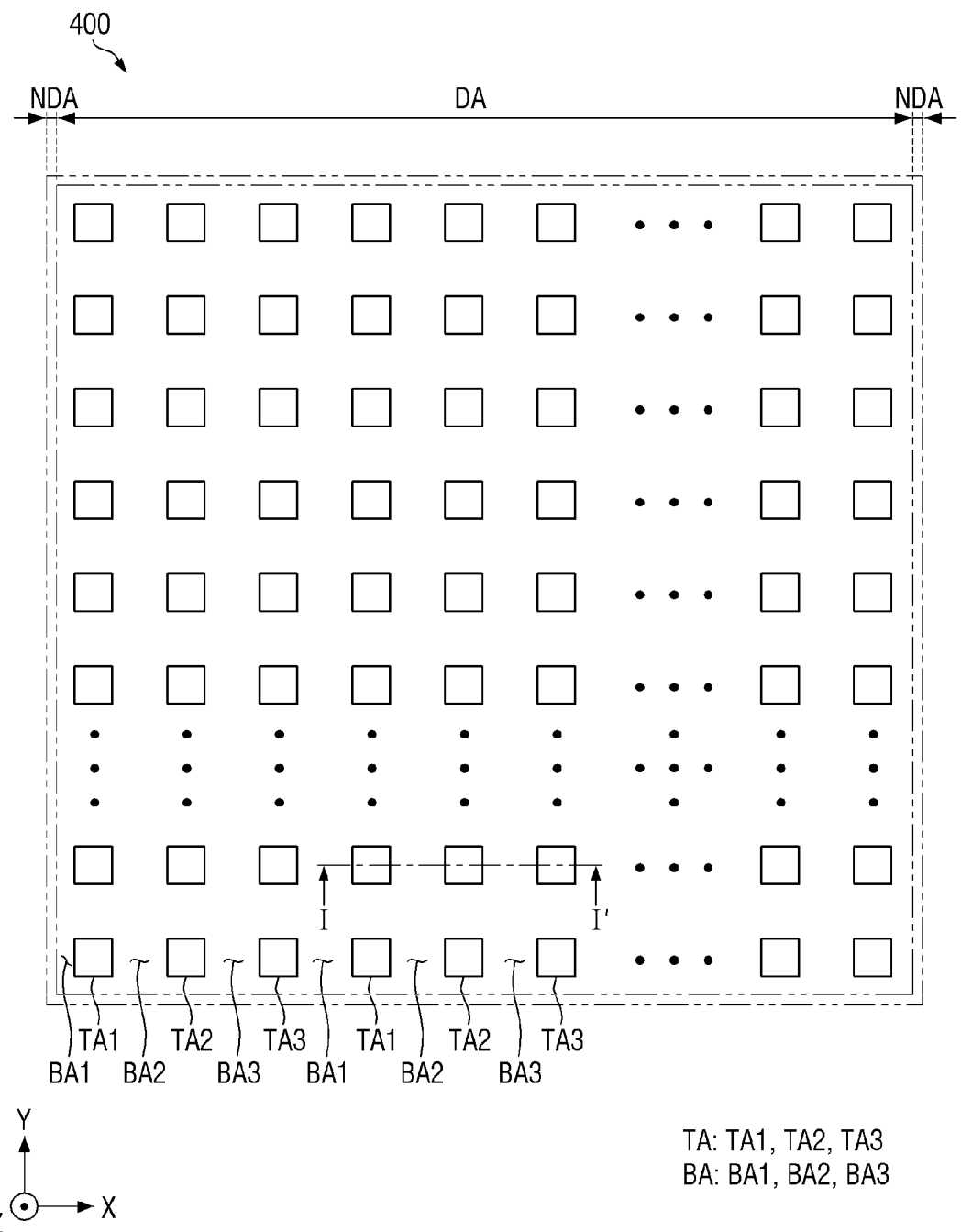
FIG. 4 is a plan view illustrating a color conversion substrate of a tiled display device according to one or more example embodiments.

FIG. 4 is a plan view illustrating a color conversion substrate of a tiled display device according to one or more example embodiments.

The color conversion substrate 400 may be disposed on the plurality of display substrates 100, and may face the plurality of display substrates 100. The color conversion substrate 400 may include a plurality of light transmitting areas TA corresponding to the plurality of light emitting areas of each of the plurality of display substrates 100, and a plurality of light blocking areas BA surrounding the plurality of light transmitting areas TA. For example, the plurality of light transmitting areas TA may include first to third light transmitting areas TA1, TA2, and TA3, and the plurality of light blocking areas BA may include first to third light blocking areas BA1, BA2, and BA3. The first to third light transmitting areas TA1, TA2, and TA3 may correspond to the first to third light emitting areas LA1, LA2, and LA3 of the display substrate 100, respectively. Each of the first to third light blocking areas BA1, BA2, and BA3 may be disposed at one side of each of the first to third light transmitting areas TA1, TA2, and TA3, and may prevent the color mixture of light emitted from the first to third light transmitting areas TA1, TA2, and TA3.

The color conversion substrate 400 may convert a peak wavelength of light emitted from the light emitting area of the display substrate 100 to transmit the light, or may maintain a peak wavelength of light emitted from the light emitting area of the display substrate 100 to transmit the light. For example, the first light transmitting area TA1 may convert a peak wavelength of light emitted from the display substrate 100 to emit light of a first color. The second light transmitting area TA2 may convert a peak wavelength of light emitted from the display substrate 100 to emit light of a second color different from the first color. The third light transmitting area TA3 may maintain a peak wavelength of light emitted from the display substrate 100 to emit light of a third color different from the first and second colors. For example, the light of the first color may be red light having a peak wavelength ranging from 610 nm to 650 nm, the light of the second color may be green light having a peak wavelength ranging from 510 nm to 550 nm, and the third color light may be blue light having a peak wavelength ranging from 440 nm to 480 nm.

The first to third light transmitting areas TA1, TA2, and TA3 may be repeatedly arranged sequentially along the first direction (X-axis direction) of the display area DA. For example, the width of the first light transmitting area TA1 in the first direction (X-axis direction) may be greater than the width of the second light transmitting area TA2 in the first direction, and the width of the second light transmitting area TA2 in the first direction (X-axis direction) may be greater than the width of the third light transmitting area TA3 in the first direction (X-axis direction). The width of each of the first to third light transmitting areas TA1, TA2, and TA3 is not limited to the embodiment illustrated in FIG. 4. For example, in some other embodiments, the width of the first light transmitting area TA1 in the first direction (X-axis direction), the width of the second light transmitting area TA2 in the first direction (X-axis direction), and the width of the third light transmitting area TA3 in the first direction (X-axis direction) may be substantially the same as each other.

For example, the area of the first light transmitting area TA1 may be larger than the area of the second light transmitting area TA2, and the area of the second light transmitting area TA2 may be larger than the area of the third light transmitting area TA3. The area of each of the first to third light transmitting area s TA1, TA2, and TA3 is not limited to the embodiment illustrated in FIG. 4. In another example, the area of the first light transmitting area TA1, the area of the second light transmitting area TA2, and the area of the third light transmitting area TA3 may be substantially equal to each other.

Figure 5:
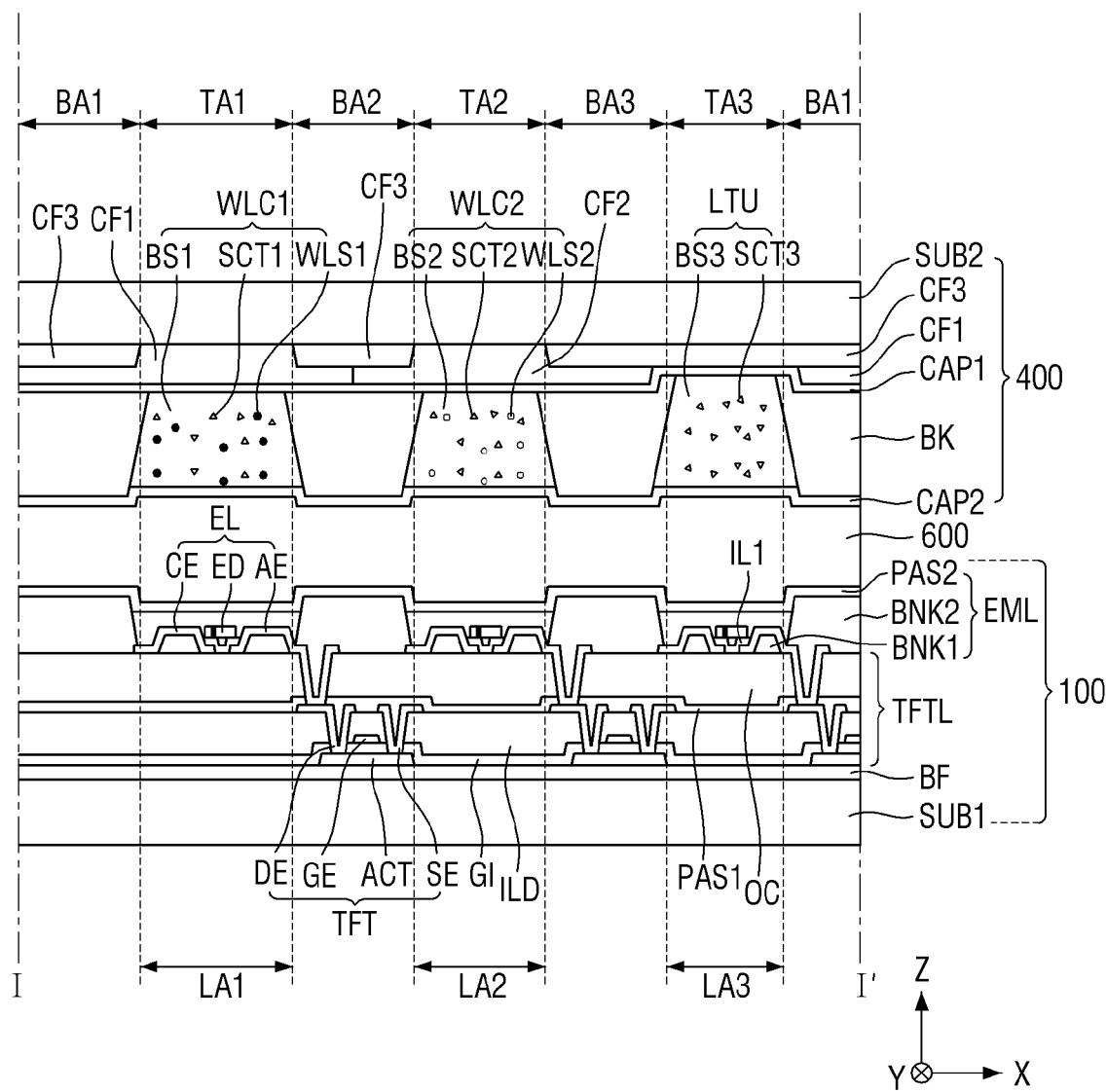
FIG. 5 is a cross-sectional view taken along the line I-I' of FIGS. 3 and 4.

FIG. 5 is a cross-sectional view taken along the line I-I' of FIGS. 3 and 4.

Referring to FIG. 5, the display area DA of the display substrate 100 may include first to third light emitting areas LA1, LA2, and LA3. Each of the first to third light emitting areas LA1, LA2, and LA3 may be an area in which light generated from the light emitting element of the display substrate 100 is emitted to the outside of the display substrate 100.

The display substrate 100 may include a first base member SUB1, a buffer layer BF, a thin film transistor layer TFTL, and a light emitting element layer EML.

The first base member SUB1 may be a base substrate, and may be made of an insulating material such as a polymer resin. For example, the first base member SUB1 may be a rigid substrate. When the first base member SUB1 is a rigid substrate, the first base member SUB1 may include a glass material or a metal material, but the material thereof is not limited thereto. In another example, the first base member SUB1 may be a flexible substrate capable of bending, folding, rolling, or the like. When the first base member SUB1 is a flexible substrate, the first base member SUB1 may include polyimide PI, but the material thereof is not limited thereto.

The buffer layer BF may be disposed on the first base member SUB1. The buffer layer BF may be formed of an inorganic film capable of preventing the infiltration of air or moisture. For example, the buffer layer BF may include a plurality of inorganic films alternately stacked. The buffer layer BF may be formed as a multi-layer film in which at least one inorganic film of a silicon nitride layer, a silicon oxy nitride layer, a silicon oxide layer, a titanium oxide layer, and an aluminum oxide layer is alternately stacked, but is not limited thereto.

The thin film transistor layer TFTL may include a thin film transistor TFT, a gate insulating film GI, an interlayer insulating film ILD, a first passivation layer PAS1, and a planarization layer OC.

The thin film transistor TFT may be disposed on the buffer layer BF, and may constitute a pixel circuit of each of a plurality of pixels. For example, the thin film transistor TFT may be a driving transistor or a switching transistor of a pixel circuit. The thin film transistor TFT may include a semiconductor layer ACT, a gate electrode GE, a source electrode SE, and a drain electrode DE.

The semiconductor layer ACT may be provided on the buffer layer BF. The semiconductor layer ACT may overlap the gate electrode GE, the source electrode SE, and the drain electrode DE. The semiconductor layer ACT may directly contact the source electrode SE and the drain electrode DE, and may face the gate electrode GE with the gate insulating layer GI interposed therebetween.

The gate electrode GE may be disposed on the gate insulating film GI. The gate electrode GE may overlap the semiconductor layer ACT with the gate insulating film GI interposed therebetween.

The source electrode SE and the drain electrode DE may be disposed to be spaced from each other on the interlayer insulating film ILD. The source electrode SE may be in contact with one end of the semiconductor layer ACT through a contact hole provided in the gate insulating film GI and the interlayer insulating film ILD. The drain electrode DE may be in contact with the other end of the semiconductor layer ACT through a contact hole provided in the gate insulating film GI and the interlayer insulating film ILD. The drain electrode DE may be connected to the first electrode AE of the light emitting member EL through a contact hole provided in the first passivation layer PAS1 and the planarization layer OC.

The gate insulating film GI may be provided on the semiconductor layer ACT. For example, the gate insulating film GI may be disposed on the semiconductor layer ACT and the buffer layer BF, and may insulate the semiconductor layer ACT from the gate electrode GE. The gate insulating film GI may include a contact hole through which the source electrode SE passes to contact the semiconductor layer ACT and a contact hole through which the drain electrode DE passes to contact the semiconductor layer ACT.

The interlayer insulating film ILD may be disposed on the gate electrode GE. For example, the interlayer insulating film ILD may include a contact hole through which the source electrode SE passes and a contact hole through which the drain electrode DE passes. Here, the contact holes of the interlayer insulating film ILD may be connected to (e.g., communicate with) the contact holes of the gate insulating film GI.

The first passivation layer PAS1 may be provided on the thin film transistor TFT to protect the thin film transistor TFT. For example, the first passivation layer PAS1 may be on the interlayer insulating film ILD. For example, the first passivation layer PAS1 may include a contact hole through which the first electrode AE passes to contact the drain electrode DE of the thin film transistor TFT.

The planarization layer OC may be provided on the first passivation layer PAS1 to planarize the upper end of the thin film transistor TFT. For example, the planarization layer OC may include a contact hole through which the first electrode AE of the light emitting member EL passes. Here, the contact hole of the planarization layer OC may be connected to the contact hole of the first passivation layer PAS1.

The light emitting element layer EML may include a light emitting member EL, first and second banks BNK1 and BNK2, and a second passivation layer PAS2.

The light emitting member EL may be provided on the thin film transistor TFT. For example, the light emitting member EL may be provided on the thin film transistor layer TFTL. The light emitting member EL may include a first electrode AE, a second electrode CE, and a light emitting element ED.

The first electrode AE may be provided on the planarization layer OC. For example, the first electrode AE may be disposed on the first bank BNK1 disposed on the planarization layer OC to cover the first bank BNK1. The first electrode AE may be disposed to overlap one of the first to third light emitting areas LA1, LA2, and LA3 defined by the second bank BNK2. The first electrode AE may be connected to the drain electrode DE of the thin film transistor TFT. The first electrode AE may be an anode electrode of the light emitting element ED, but is not limited thereto.

The second electrode CE may be provided on the planarization layer OC. For example, the second electrode CE may be disposed on the first bank BNK1 disposed on the planarization layer OC to cover the first bank BNK1. The second electrode CE may be disposed to overlap one of the first to third light emitting areas LA1, LA2, and LA3 defined by the second bank BNK2. For example, the second electrode CE may receive a common voltage supplied to all pixels. The second electrode CE may be a cathode electrode of the light emitting element ED, but is not limited thereto.

The first insulating layer IL1 may cover a part of the first electrode AE and a part of the second electrode CE, which are adjacent to each other, and may insulate the first and second electrodes AE and CE from each other.

The light emitting element ED may be disposed between the first electrode AE and the second electrode CE on the planarization layer OC. The light emitting element ED may be disposed on the first insulating layer IL1. One end of the light emitting element ED may be connected to the first electrode AE, and the other end of the light emitting element ED may be connected to the second electrode CE. For example, the plurality of light emitting elements ED may include an active layer having the same material to emit light of the same wavelength or light of the same color. The light emitted from each of the first to third light emitting areas LA1, LA2, and LA3 may have the same color. For example, the plurality of light emitting elements ED may emit light of a third color or blue light having a peak wavelength ranging from 440 nm to 480 nm. Each of the first to third light emitting areas LA1, LA2, and LA3 may emit light of a third color or blue light.

The second bank BNK2 may be disposed on the planarization layer OC to define the first to third light emitting areas LA1, LA2, and LA3. For example, the second bank BNK2 may surround each of the first to third light emitting areas LA1, LA2, and LA3, but the present disclosure is not limited thereto. The second bank BNK2 may separate and insulate the first electrode AE or the second electrode CE of each of the plurality of light emitting members EL. The first to third light emitting areas LA1, LA2, and LA3 may correspond to the first to third light transmitting areas TA1, TA2, and TA3 of the color conversion substrate 400, and the second bank BNK2 may correspond to the plurality of light blocking areas BA of the color conversion substrate 400.

The second passivation layer PAS2 may be disposed on the plurality of light emitting members EL and the second bank BNK2. The second passivation layer PAS2 may cover the plurality of light emitting members EL, and may protect the plurality of light emitting members EL. The second passivation layer PAS2 may prevent the penetration of impurities such as moisture or air from the outside to prevent damage to the plurality of light emitting members EL.

The display substrate 100 of each of the plurality of display devices 10 may include first and second electrodes AE and CE, a light emitting element ED, and a second passivation layer PAS2 covering the light emitting element ED. Accordingly, in the display substrate 100, an additional encapsulation layer may not be provided, the thickness of the display substrate 100 may be relatively reduced, and the area of the non-display area NDA of the display substrate 100 may be reduced or minimized. Therefore, in the tiled display device TD, the bezel area or dead space of the display substrate 100 may be reduced or minimized, and the distance between the plurality of display devices 10 may be reduced or minimized. Further, in the tiled display device TD, the boundary portion or the non-display area NDA between the plurality of display devices 10 may be prevented from being visually recognized, the disconnection feeling between the plurality of display devices 10 may be removed, and the immersion of an image may be improved.

The color conversion substrate 400 may be disposed on the plurality of display substrates 100, and may face the plurality of display substrates 100. The color conversion substrate 400 may include first to third light transmitting areas TA1, TA2, and TA3 and first to third light blocking areas BA1, BA2, and BA3. The first to third light transmitting areas TA1, TA2, and TA3 of the color conversion substrate 400 may correspond to the first to third light emitting areas LA1, LA2, and LA3 of the display substrate 100, respectively. Each of the first to third light blocking areas BA1, BA2, and BA3 may be disposed at one side of each of the first to third light transmitting areas TA1, TA2, and TA3, and may prevent the color mixing of light emitted from the first to third light transmitting areas TA1, TA2, and TA3.

The color conversion substrate 400 may include a second base member SUB2, first to third color filters CF1, CF2, and CF3, a first capping layer CAP1, a light blocking member BK, and first and second wavelength conversion units WLC1 and WLC2, a light transmission unit LTU, and a second capping layer CAP2.

The second base member SUB2 may be a base substrate, and may be made of an insulating material such as a polymer resin. The second base member SUB2 may include a light transmitting material to transmit light emitted from the first to third light transmitting areas TA1, TA2, and TA3. For example, the second base member SUB2 may be a rigid substrate. When the second base member SUB2 is a rigid substrate, the second base member SUB2 may include a glass material or a metal material, but the material thereof is not limited thereto. In another example, the second base member SUB2 may be a flexible substrate capable of bending, folding, rolling, or the like. When the second base member SUB2 is a flexible substrate, the second base member SUB2 may include polyimide PI, but the material thereof is not limited thereto.

In one or more embodiments, a separate buffer layer is disposed on the second base member SUB2 to prevent impurities from flowing into one surface of the second base member SUB2. In this case, the first to third color filters CF1, CF2, and CF3 may be in direct contact with the buffer layer.

The first color filter CF1 may be disposed on the second base member SUB2, and may overlap the first light transmitting area TA1. The first color filter CF1 may selectively transmit light of a first color (for example, red light), and may block or absorb light of a second color (for example, green light) and light of a third color (for example, blue light). For example, the first color filter CF1 may be a red color filter, and may include a red colorant. The red colorant may be made of a red dye or a red pigment.

The second color filter CF2 may be disposed on the second base member SUB2, and may overlap the second light transmitting area TA2. The second color filter CF2 may selectively transmit light of a second color (for example, green light), and may block or absorb light of a first color (for example, red light) and light of a third color (for example, blue light). For example, the second color filter CF2 may be a green color filter, and may include a green colorant. The green colorant may be made of a green dye or a green pigment.

The third color filter CF3 may be disposed on the second base member SUB2, and may overlap the third light transmitting area TA3. The third color filter CF3 may overlap the first to third light blocking areas BA1, BA2, and BA3. The third color filter CF3 may overlap the first color filter CF1 or the second color filter CF2 in each of the first to third light blocking areas BA1, BA2, and BA3, thereby preventing the color mixing of light emitted from the first to third light transmitting areas TA1, TA2, and TA3. The third color filter CF3 may selectively transmit light of a third color (for example, blue light), and may block or absorb light of a first color (for example, red light) and light of a second color (for example, green light). For example, the third color filter CF3 may be a blue color filter, and may include a blue colorant. The blue colorant may be made of a blue dye or a blue pigment.

When the third color filter CF3 includes a blue colorant, external light or reflected light having passed through the third color filter CF3 may have a blue wavelength band. The eye color sensitivity perceived by a user's eye may be changed depending on the color of light. For example, light having a blue wavelength band may be perceived to be less sensitive to the user than light having a green wavelength band and light having a red wavelength band. Accordingly, the third color filter CF3 includes the blue colorant, and thus the user may recognize the reflected light with less sensitivity.

The first to third color filters CF1, CF2, and CF3 may absorb a part of light flowing from the outside of the display device 10 into the color conversion substrate 400 to reduce reflected light due to external light. Therefore, the first to third color filters CF1, CF2, and CF3 may prevent or reduce color distortion due to external light reflection.

The first capping layer CAP1 may cover the first to third color filters CF1, CF2, and CF3. The first capping layer CAP1 may prevent or reduce the penetration of impurities such as moisture or air from the outside to prevent damage or contamination of the first to third color filters CF1, CF2, and CF3. The first capping layer CAP1 may prevent the colorants included in the first to third color filters CF1, CF2, and CF3 from being diffused into the first and second wavelength conversion units WLC1, WLC2 or the light transmission unit LTU.

The first capping layer CAP1 may include an inorganic material. For example, the first capping layer CAP1 may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride.

The plurality of light blocking members BK may overlap each of the first to third light blocking areas BA1, BA2, and BA3. The plurality of light blocking members BK may be directly disposed on the first capping layer CAP1 disposed on the first to third color filters CF1, CF2, and CF3. The plurality of light blocking members BK may block the transmission of light. For example, the plurality of light blocking members BK may improve the color reproduction rate by preventing light from invading and mixing between the first to third light transmitting areas TA1, TA2, and TA3. The plurality of light blocking members BK may be arranged in a grid shape surrounding the first to third light transmitting areas TA1, TA2, and TA3 on a plane.

The light blocking member BK may include an organic light blocking material and a liquid repellent component. Here, the liquid repellent component may be composed of a fluorine-containing monomer or a fluorine-containing polymer, and specifically, may include a fluorine-containing aliphatic polycarbonate. For example, the light blocking member BK may be made of a black organic material including a liquid repellent component. The light blocking member BK may be formed through a coating and exposure process of an organic light blocking material including a liquid repellent component.

The light blocking member BK may include a liquid repellent component, thereby separating the first and second wavelength conversion units WLC1 and WLC2 and the light transmission unit LTU into the corresponding light transmitting areas. For example, when the first and second wavelength conversion units WLC1 and WLC2 and the light transmission unit LTU are formed by an inkjet method, an ink composition may flow on the upper surface of the light blocking member BK. In this case, the light blocking member BK may include the liquid repellent component, so that the ink composition may be induced to flow to the respective light transmitting areas. Therefore, the light blocking member BK may prevent the ink composition from being mixed.

Accordingly, in the tiled display device TD, during the bonding process of the plurality of display substrates 100 and the color conversion substrate 400, the thicknesses of the first and second wavelength conversion units WLC1 and WLC2 and the light transmission unit LTU may be uniformly maintained, and the thickness of the filler 600 between the display substrate 100 and the color conversion substrate 400 may be uniformly maintained. Therefore, in the tiled display device, defective bonding and occurrence of stains may be prevented.

The first wavelength conversion unit WLC1 may be disposed on the first color filter CF1 to overlap the first transmitting area TA1. For example, the first wavelength conversion unit WLC1 may be disposed on the first capping layer CAP1. The first wavelength conversion unit WLC1 may be surrounded by the light blocking member BK. The first wavelength conversion unit WLC1 may include a first base resin BS1, a first scatterer SCT1, and a first wavelength shifter WLS1.

The first base resin BS1 may include a material having relatively high light transmittance. The first base resin BS1 may include a transparent organic material. For example, the first base resin BS1 may include at least one of organic materials such as epoxy resin, acrylic resin, cardo resin, and imide resin.

The first scatterer SCT1 may have a different refractive index from the first base resin BS1, and may form an optical interface with the first base resin BS1. For example, the first scatterer SCT1 may include a light scattering material or light scattering particles that scatter at least a part of transmitted light. For example, the first scatterer SCT1 may include a metal oxide such as titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$), or may include organic particles such as acrylic resin particles or urethane resin particles. The first scatterer SCT1 may scatter light in a random direction irrespective of the incident direction of incident light, without substantially changing the peak wavelength of incident light.

The first wavelength shifter WLS1 may convert or shift the peak wavelength of incident light to a first peak wavelength. For example, the first wavelength shifter WLS1 may convert blue light provided from the display substrate 100 into red light having a single peak wavelength ranging from 610 nm to 650 nm, and may emit the red light. The first wavelength shifter WLS1 may be (or may include) a quantum dot, a quantum rod, or a phosphor. The quantum dot may be a particulate material that emits light of a specific color as electrons transition from a conduction band to a valence band.

For example, the quantum dot may be a semiconductor nanocrystalline material. The quantum dot may have a specific band gap according to its composition and size to absorb light and then emit light having a unique wavelength. Examples of semiconductor nanocrystals of the quantum dot include group IV nanocrystals, group II-VI compound nanocrystals, group III-V compound nanocrystals, group IV-VI nanocrystals, and combinations thereof.

The group II-VI compounds may be selected from two-element compounds selected from the group consisting of CdSe, CdTe, ZnS, ZnSe, ZnTe, ZnO, HgS, HgSe, HgTe, MgSe, MgS, and mixtures thereof; three-element compounds selected from the group consisting of InZnP, AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof; and four-element compounds selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof.

The group III-V compounds may be selected from two-element compounds selected from the group consisting of GaN, GaP, GaAs, GaSb, AlN, AlP, AlAs, AlSb, InN, InP, InAs, InSb, and mixtures thereof; three-element compounds selected from the group consisting of GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP, and mixtures thereof; and four-element compounds selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof.

The group IV-VI compounds may be selected from two-element compounds selected from the group consisting of SnS, SnSe, SnTe, PbS, PbSe, PbTe, and mixtures thereof; three-element compounds selected from the group consisting of SnSeS, SnSeTe, SnSTe, PbSeS, PbSeTe, PbSTe, SnPbS, SnPbSe, SnPbTe, and mixtures thereof; and four-element compounds selected from the group consisting of SnPbSSe, SnPbSeTe, SnPbSTe, and mixtures thereof. The group IV elements may be selected from the group consisting of Si, Ge, and a mixture thereof. The group IV compounds may be two-element compounds selected from the group consisting of SiC, SiGe, and a mixture thereof.

For example, the two-element compound, the three-element compound, or the four-element compound may be present in a particle at a uniform concentration, or may be present in the same particle at a non-uniform concentration in which concentration distribution may be partially divided into different states.

For example, the quantum dot may have a core-shell structure including a core including the above-described nanocrystals and a shell surrounding the core. The shell of the quantum dot may serve as a protective layer for maintaining semiconductor properties by preventing the chemical denaturation of the core, and may serve as a charging layer for imparting electrophoretic properties to the quantum dot. The shell may be a monolayer or may include multiple layers. The interface between the core and the shell may have a concentration gradient in which the concentration of elements in the shell decreases toward the center of the shell. The shell of the quantum dot may be made of a metal or non-metal oxide, a semiconductor compound, or a combination thereof.

Examples of the metal or non-metal oxide may include, but are not limited to, two-element compounds such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, and $NiO$ and three-element compounds such as $MgAl_2O_4$, $CoFe_2O_4$, $NiFe_2O_4$, and $CoMn_2O_4$.

Examples of the semiconductor compound may include, but are not limited to, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and AlSb.

The light emitted by the first wavelength shifter WLS1 may have a light emission wavelength spectrum full width of half maximum (FWHM) of 45 nm or less, or 40 nm or less, or 30 nm or less, and the color purity and color reproducibility of the color displayed by the display device 10 may be further improved. The light emitted by the first wavelength shifter WLS1 may be emitted toward various directions regardless of an incident direction of incident light. Therefore, the side visibility of the red color displayed in the first light transmitting area TA1 may be improved.

A portion of the blue light provided from the display substrate 100 may pass through the first wavelength conversion unit WLC1 without being converted into red light by the first wavelength shifter WLS1. From among the blue light provided from the display substrate 100, light that is incident on the first color filter CF1 without being converted by the first wavelength conversion unit WLC1 may be blocked by the first color filter CF1. Further, from among the blue light provided from the display substrate 100, a portion converted to red light by the first wavelength conversion unit WLC1 may be transmitted to the outside through the first color filter CF1. Therefore, the first light transmitting area TA1 may emit red light.

The second wavelength conversion unit WLC2 may be disposed on the second color filter CF2 to overlap the second light transmitting area TA2. For example, the second wavelength conversion unit WLC2 may be disposed on the first capping layer CAP1. The second wavelength conversion unit WLC2 may be surrounded by the light blocking member BK. The second wavelength conversion unit WLC2 may include a second base resin BS2, a second scatterer SCT2, and a second wavelength shifter WLS2.

The second base resin BS2 may include a material having relatively high light transmittance. The second base resin BS2 may include a transparent organic material. For example, the second base resin BS2 may include the same material as the first base resin BS1 or may include the material exemplified in the first base resin BS1.

The second scatterer SCT2 may have a different refractive index from the second base resin BS2, and may form an optical interface with the second base resin BS2. For example, the second scatterer SCT2 may include a light scattering material or light scattering particles that scatter at least a part of transmitted light. For example, the second scatterer SCT2 may include the same material as the first scatterer SCT1, or may include the material exemplified in the first scatterer SCT1. The second scatterer SCT2 may scatter light in a random direction irrespective of the incident direction of incident light, without substantially changing the peak wavelength of incident light.

The second wavelength shifter WLS2 may convert or shift the peak wavelength of incident light to a second peak wavelength different from the first peak wavelength of the first wavelength shifter WLS1. For example, the second wavelength shifter WLS2 may convert blue light provided from the display substrate 100 into green light having a single peak wavelength ranging from 510 nm to 550 nm, and may emit the green light. The second wavelength shifter WLS2 may be (or may include) a quantum dot, a quantum rod, or a phosphor. The quantum dot may be a particulate material that emits light of a specific color as electrons transition from a conduction band to a valence band. The second wavelength shifter WLS2 may include the same material as the material exemplified in the first wavelength shifter WLS1. The second wavelength shifter WLS2 may be formed as a quantum dot, a quantum rod, or a phosphor such that the wavelength conversion range of the second wavelength shifter WLS2 is different from the wavelength conversion range of the first wavelength shifter WLS1.

The light transmission unit LTU may be disposed on the third color filter CF3 to overlap the third light transmitting area TA3. For example, the light transmission unit LTU may be disposed on the first capping layer CAP1. The light transmission unit LTU may be surrounded by the light blocking member BK. The light transmitting part LTU may transmit incident light while maintaining the peak wavelength of the incident light. The light transmission unit LTU may include a third base resin BS3 and a third scatterer SCT3.

The third base resin BS3 may include a material having relatively high light transmittance. The third base resin BS3 may include a transparent organic material. For example, the third base resin BS3 may include the same material as the first base resin BS1 or the second base resin BS2, or may include the material exemplified in the first base resin BS1 or the second base resin BS2.

The third scatterer SCT3 may have a different refractive index from the third base resin BS3, and may form an optical interface with the third base resin BS3. For example, the third scatterer SCT3 may include a light scattering material or light scattering particles that scatter at least a part of transmitted light. For example, the third scatterer SCT3 may include the same material as the first scatterer SCT1 or the second scatterer SCT2, or may include the material exemplified in the first scatterer SCT1 or the second scatterer SCT2. The third scatterer SCT3 may scatter light in a random direction irrespective of the incident direction of incident light, without substantially changing the peak wavelength of incident light.

The second capping layer CAP2 may cover the first and second wavelength conversion units WLC1 and WLC2, the light transmission unit LTU, and the light blocking member BK. For example, the second capping layer CAP2 may encapsulate the first and second wavelength conversion units WLC1 and WLC2 and the light transmission unit LTU to prevent the damage or contamination of the first and second wavelength conversion units WLC1 and WLC2 and the light transmission unit LTU. The second capping layer CAP2 may include the same material as the first capping layer CAP1, or may include the material exemplified in the first capping layer CAP1.

The filler 600 may be disposed in a space between the plurality of display substrates 100 and the color conversion substrate 400, and may be surrounded by the sealing member 500 (e.g., as shown in FIG. 2). The filler 600 may fill the space between the plurality of display substrates 100 and the color conversion substrate 400. For example, the filler 600 may be made of an organic material and transmit light. The filler 600 may be made of a silicon-based organic material or an epoxy-based organic material, but the material thereof is not limited thereto. The filler 600 may have an adhesive force, and may fix the plurality of display substrates 100 and the color conversion substrates 400 to each other.

Figure 6:
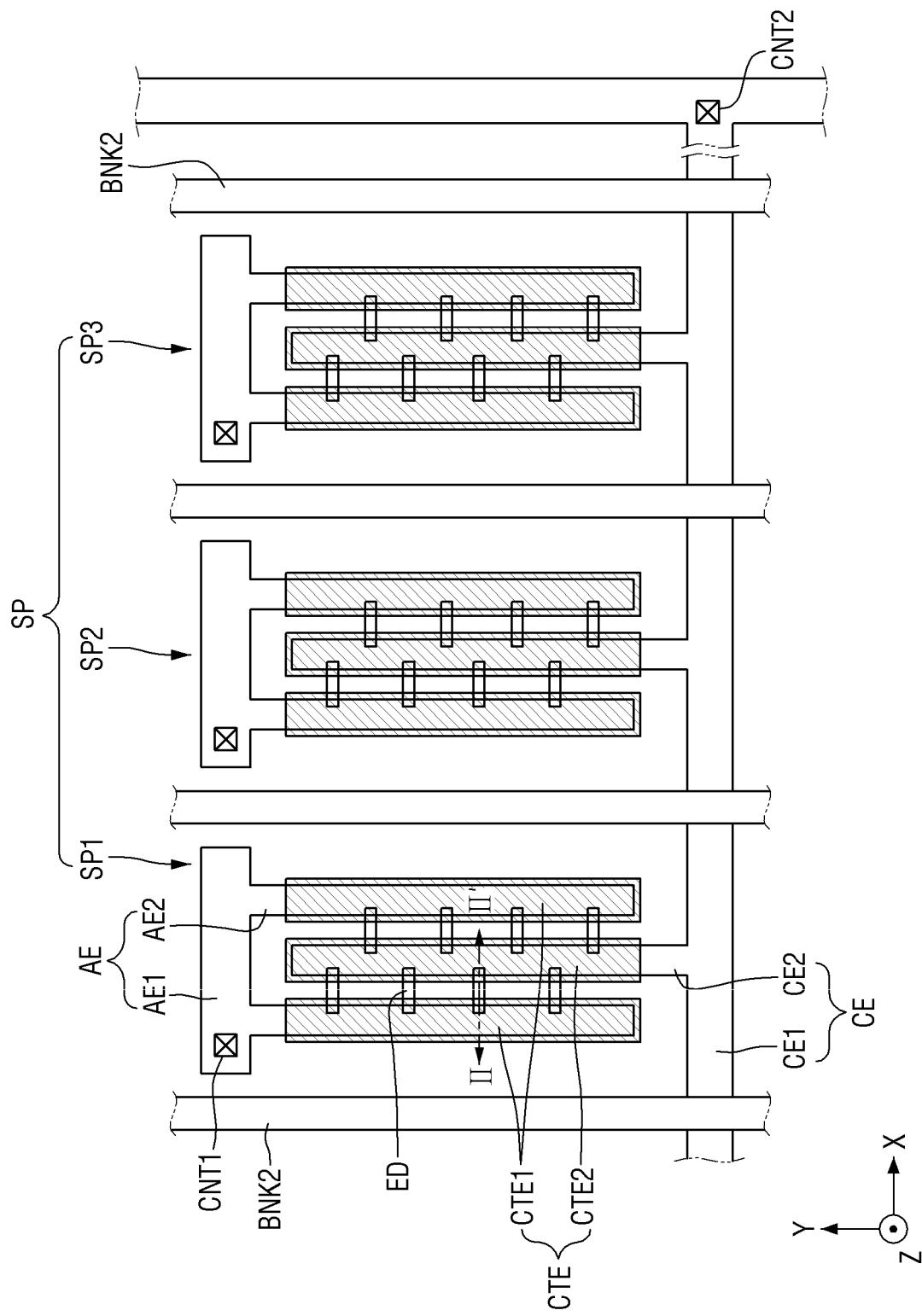
FIG. 6 is a plan view illustrating a pixel of a display device according to one or more example embodiments.

FIG. 6 is a plan view illustrating a pixel of a display device according to one or more example embodiments.

Referring to FIG. 6, each of the plurality of pixels SP may include first to third sub-pixels SP1, SP2, and SP3. The first to third sub-pixels SP1, SP2, and SP3 may correspond to the first to third light emitting areas LA1, LA2, and LA3, respectively. The light emitting elements ED of the first to third sub-pixels SP1, SP2, and SP3 may emit light through the first to third light emitting areas LA1, LA2, and LA3 (e.g., see FIG. 5), respectively.

Each of the first to third sub-pixels SP1, SP2, and SP3 may emit light of the same color. For example, each of the first to third sub-pixels SP1, SP2, and SP3 may include the same type of light emitting element ED, and may emit light of a third color or blue light. In another example, the first sub-pixel SP1 may emit light of a first color or red light, the second sub-pixel SP2 may emit light of a second color or green light, and the third sub-pixel SP3 may emit light of a third color or blue light.

Each of the first to third sub-pixels SP1, SP2, and SP3 may include first and second electrodes AE and CE, at least one light emitting element ED, a plurality of contact electrodes CTE, and a plurality of second banks BNK2.

The first and second electrodes AE and CE may be electrically connected to the light emitting element ED to receive a voltage (e.g., a set voltage or a predetermined voltage), and the light emitting element ED may emit light of a specific wavelength band in response to the voltage applied by the first and second electrodes AE and CE across the light emitting element ED. At least a part of the first electrode AE and at least a part of the second electrode CE may form an electric field in the pixel SP, and the light emitting elements ED may be aligned by the electric field.

For example, the first electrode AE may be a pixel electrode separated for each of the first to third sub-pixels SP1, SP2, and SP3, and the second electrode CE may be a common electrode commonly connected to the first to third sub-pixels SP1, SP2, and SP3. Any one of the first electrode AE and the second electrode CE may be an anode electrode of the light emitting element ED, and the other one thereof may be a cathode electrode of the light emitting element ED.

The first electrode AE may include a first electrode stem portion AE1 extending in the first direction (X-axis direction), and at least one first electrode branch portion AE2 branched from the first electrode stem portion AE1 and extending in the second direction (Y-axis direction).

The first electrode stem portion AE1 of each of the first to third sub pixels SP1, SP2, and SP3 may be spaced from the first electrode stem portion AE1 of the adjacent sub-pixel, and may be disposed on a virtual extension line of the first electrode stem portion AE1 of the sub-pixel adjacent in the first direction (X-axis direction). The first electrode stem portions AE1 of the first to third sub-pixels SP1, SP2, and SP3 may receive different signals from each other, and may be independently driven.

The first electrode branch portion AE2 may be branched from the first electrode stem portion AE1 and extend in the second direction (Y-axis direction). One end of the first electrode branch portion AE2 may be connected to the first electrode stem portion AE1, and the other end of the first electrode branch portion AE2 may be spaced from the second electrode stem portion CE1 facing the first electrode stem portion AE1.

The second electrode CE may include a second electrode stem portion CE1 extending in the first direction (X-axis direction), and a second electrode branch portion CE2 branched from the second electrode stem portion CE1 and extending in the second direction (Y-axis direction). The second electrode stem portion CE1 of each of the first to third sub-pixels SP1, SP2, and SP3 may be connected to the second electrode stem portion CE1 of the adjacent sub-pixel. The second electrode stem portion CE1 may extend (e.g., extend continuously) in the first direction (X-axis direction) to traverse the plurality of pixels SP. The second electrode stem portion CE1 may be connected to an outer portion of the display area DA or a portion extending from the non-display area NDA in one direction.

The second electrode branch portion CE2 may be spaced from the first electrode branch portion AE2 and face the first electrode branch portion AE2. One end of the second electrode branch portion CE2 may be connected to the second electrode stem portion CE1, and the other end of the second electrode branch portion CE2 may be spaced from the first electrode stem portion AE1.

The first electrode AE may be electrically connected to the thin film transistor layer TFTL (e.g., see FIG. 5) of the display substrate 100 through a first contact hole CNT1, and the second electrode CE may be electrically connected to the thin film transistor layer TFTL of the display substrate 100 through a second contact hole CNT2. For example, the first contact hole CNT1 may be disposed in each of the plurality of first electrode stem portions AE1, and the second contact hole CNT2 may be disposed in the second electrode stem portion CE1, but the present disclosure is not limited thereto.

The second bank BNK2 may be disposed at the boundary between the plurality of pixels SP. For example, each of the sub-pixels SP1, SP2, SP3, may be surrounded or bounded by the second bank BNK2 on at least two opposite sides, such that the second bank BNK2 is between two adjacent sub-pixels SP1, SP2, SP3, and between two adjacent pixels SP. The plurality of first electrode stem portions AE1 may be spaced from each other based on the second bank BNK2. The second bank BNK2 may extend in the second direction (Y-axis direction), and may be disposed at the boundary of the pixels SP arranged in the first direction (X-axis direction). Additionally, the second bank BNK2 may also be arranged at the boundary of the pixels SP arranged in the second direction (Y-axis direction). The second bank BNK2 may define a boundary of the plurality of pixels SP.

The second bank BNK2 may prevent ink from overflowing the boundary of the pixels SP when ejecting (e.g., spraying) the ink in which the light emitting elements ED are dispersed in the process of manufacturing the display substrate 100. The second bank BNK2 may separate the inks in which different light emitting elements ED are dispersed so as not to be mixed with each other.

The light emitting element ED may be disposed between the first electrode AE and the second electrode CE. One end of the light emitting element ED may be connected to the first electrode AE, and the other end of the light emitting element ED may be connected to the second electrode CE. For example, the light emitting element ED may be connected to the first electrode AE through the first contact electrode CTE1, and may be connected to the second electrode CE through the second contact electrode CTE2.

The plurality of light emitting elements ED may be disposed to be spaced from each other, and may be aligned to be substantially parallel to each other. The distance between the light emitting elements ED is not particularly limited. Some of the plurality of light emitting elements ED may be disposed adjacent to each other, some of the plurality of light emitting elements ED may be spaced from each other at regular intervals, and some of the plurality of light emitting elements ED may have non-uniform density and may be aligned in a specific direction. For example, each of the plurality of light emitting elements ED may be disposed in a direction perpendicular to the direction in which the first electrode branch portion AE2 or the second electrode branch portion CE2 extends. In another example, each of the plurality of light emitting elements ED may be disposed in a direction oblique to the direction in which the first electrode branch portion AE2 or the second electrode branch portion CE2 extends.

The plurality of light emitting elements ED may include an active layer having the same material to emit light of the same wavelength band or light of the same color. The first to third sub-pixels SP1, SP2, and SP3 may emit light of the same color. For example, the plurality of light emitting elements ED may emit light of a third color or blue light having a peak wavelength ranging from 440 nm to 480 nm. Accordingly, each of the first to third light emitting areas LA1, LA2, and LA3 of the display substrate 100 may emit light of a third color or blue light. In another example, the first to third sub-pixels SP1, SP2, and SP3 may respectively include the light emitting elements ED having different active layers to emit light of different colors.

The contact electrode CTE may include first and second contact electrodes CTE1 and CTE2. The first contact electrode CTE1 may cover a part of the first electrode branch portion AE2 and a part of the light emitting element ED, and may electrically connect the first electrode branch portion AE2 and the light emitting element ED. The second contact electrode CTE2 may cover a part of the second electrode branch portion CE2 and other part of the light emitting element ED, and may electrically connect the second electrode branch portion CE2 and the light emitting element ED.

The first contact electrode CTE1 may be disposed on the first electrode branch portion AE2 and extend in the second direction (Y-axis direction). The first contact electrode CTE1 may be in contact with one end of the light emitting element ED. The light emitting element ED may be electrically connected to the first electrode AE through the first contact electrode CTE1.

The second contact electrode CTE2 may be disposed on the second electrode branch CE2 and extend in the second direction (Y-axis direction). The second contact electrode CTE2 may be spaced from the first contact electrode CTE1 in the first direction (X-axis direction). The second contact electrode CTE2 may be in contact with the other end of the light emitting element ED. The light emitting element ED may be electrically connected to the second electrode CE through the second contact electrode CTE2.

For example, the width of each of the first and second contact electrodes CTE1 and CTE2 may be greater than the width of each of the first and second electrode branch portions AE2 and CE2. In another example, each of the first and second contact electrodes CTE1 and CTE2 may cover one side of each of the first and second electrode branch portions AE2 and CE2.

Figure 7:
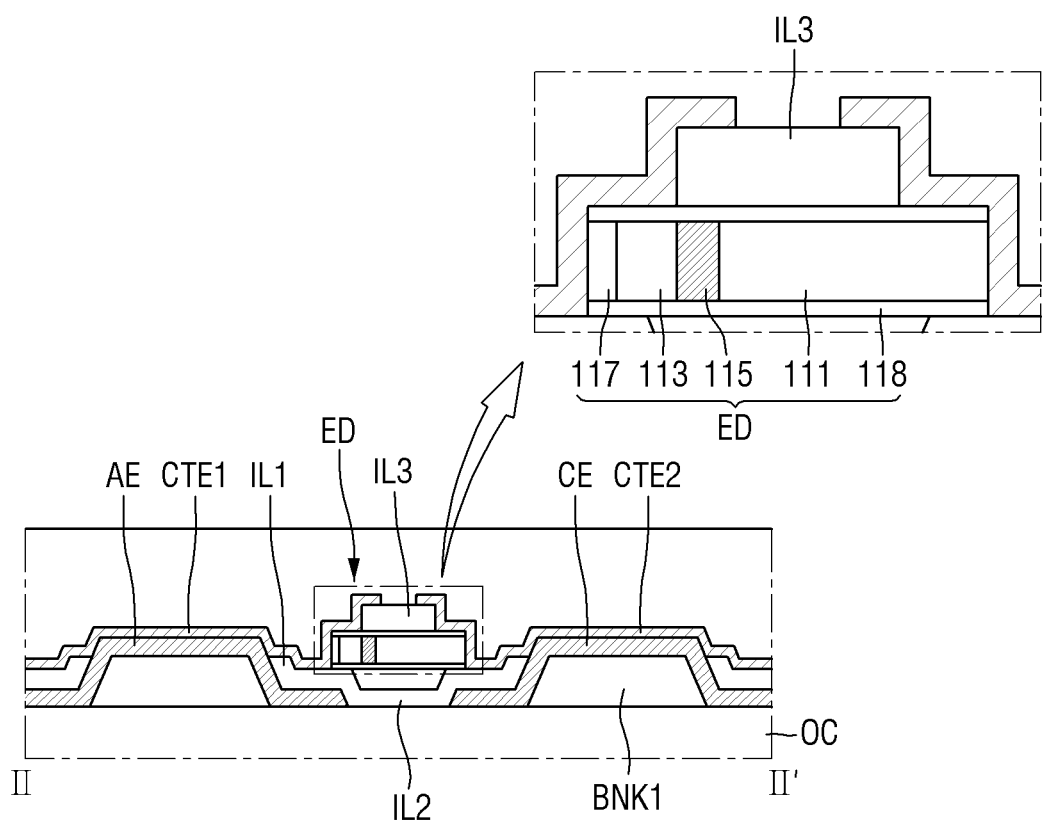
FIG. 7 is a cross-sectional view taken along the line II-II' of FIG. 6.

FIG. 7 is a cross-sectional view taken along the line II-II' of FIG. 6.

Referring to FIG. 7, the light emitting element layer EML of the display substrate 100 may be disposed on the thin film transistor layer TFTL, and may include first to third insulating layers IL1, IL2, and IL3.

The plurality of first banks BNK1 may be disposed in each of the first to third light emitting areas LA1, LA2, and LA3. Each of the plurality of first banks BNK1 may correspond to the first electrode AE or the second electrode CE. Each of the first and second electrodes AE and CE may be disposed on the corresponding first bank BNK1. For example, each of the first and second electrode branch portions AE2 and CE2 may be disposed on the corresponding first bank BNK1. The first bank BNK1 may include polyimide (PI), but the material thereof is not limited thereto.

The plurality of first banks BNK1 may protrude from the planarization layer OC, and the side surface of each of the plurality of first banks BNK1 may be inclined from the planarization layer OC. The inclined surface of the first bank BNK1 may reflect light emitted from the light emitting element ED. For example, each of the first and second electrodes AE and CE may include a material having high reflectance, and may be disposed on the inclined surface of the first bank BNK1 to reflect light emitted from the light emitting element ED in upward direction of the substrate 100.

Referring to FIG. 7 together with FIG. 6, The first electrode stem portion AE1 may include the first contact hole CNT1 penetrating the planarization layer OC. The first electrode stem portion AE1 may be electrically connected to the thin film transistor TFT through the first contact hole CNT1. Accordingly, the first electrode AE may receive an electrical signal (e.g., a set electrical signal or a predetermined electrical signal) from the thin film transistor TFT.

The second electrode stem portion CE1 may extend in the first direction (X-axis direction), and may be disposed even in the non-light emitting area in which the light emitting element ED is not disposed. The second electrode stem portion CE1 may include the second contact hole CNT2 penetrating the planarization layer OC. The second electrode stem portion CE1 may be electrically connected to a power electrode through the second contact hole CNT2. The second electrode CE may receive an electrical signal (e.g., a set electrical signal or a predetermined electrical signal) from the power electrode.

The first and second electrodes AE and CE may include a transparent conductive material. For example, each of the first and second electrodes AE and CE may include at least one of indium tin oxide (ITO), indium zinc oxide (IZO), and indium tin-zinc oxide (ITZO), but the material thereof is not limited thereto.

The first and second electrodes AE and CE may include a conductive material having high reflectance. For example, the first and second electrodes AE and CE may include a metal such as silver (Ag), copper (Cu), or aluminum (Al), which has high reflectance. The first and second electrodes AE and CE may reflect light incident from the light emitting element ED to the upper portion of the display substrate 100.

The first and second electrodes AE and CE may have a structure in which a transparent conductive material and a metal having high reflectance are stacked in one or more layers, or may be formed as a single layer including the transparent conductive material and the metal having high reflectance. For example, the first and second electrodes AE and CE have a stacked structure of ITO/silver (Ag)/ITO/IZO, or may be an alloy including aluminum (Al), nickel (Ni), or lanthanum (La), but the material thereof is not limited thereto.

The first insulating layer IL1 may be disposed on the planarization layer OC, the first electrode AE, and the second electrode CE. The first insulating layer IL1 may cover a part of each of the first and second electrodes AE and CE. For example, the first insulating layer IL1 may expose parts of the first and second electrodes AE and CE corresponding to the upper surface of the first bank BNK1, and may cover parts of the first and second electrodes AE and CE not corresponding to the upper surface of the first bank BNK1. Accordingly, the first insulating layer IL1 may include an opening exposing parts of the first and second electrodes AE and CE corresponding to the upper surface of the first bank BNK1.

For example, the first insulating layer IL1 may include an inorganic insulating material, and may include a recessed step between the first and second electrodes AE and CE. The second insulating layer IL2 may fill the recessed step of the first insulating layer IL1. Accordingly, the second insulating layer IL2 may planarize the upper surface of the first insulating layer IL1, and the light emitting element ED may be disposed on the first and second insulating layers IL1 and IL2.

The first insulating layer IL1 may protect the first and second electrodes AE and CE, and insulate the first and second electrodes AE and CE from each other. The first insulating layer IL1 may prevent the light emitting element ED from being damaged by making a direct contact with other members.

The light emitting element ED may be disposed between the first electrode AE and the second electrode CE on the first and second insulating layers IL1 and IL2. One end of the light emitting element ED may be connected to the first electrode AE, and the other end of the light emitting element ED may be connected to the second electrode CE. For example, the light emitting element ED may be connected to the first electrode AE through the first contact electrode CTE1, and may be connected to the second electrode CE through the second contact electrode CTE2.

The third insulating layer IL3 may be partially disposed on the light emitting element ED disposed between the first and second electrodes AE and CE. The third insulating layer IL3 may partially cover the outer surface of the light emitting element ED. The third insulating layer IL3 may protect the light emitting element ED. The third insulating layer IL3 may cover the outer surface of the light emitting element ED.

The contact electrode CTE may include first and second contact electrodes CTE1 and CTE2. The first contact electrode CTE1 may cover the first electrode branch portion AE2 and a part (e.g., a first end portion) of the light emitting element ED, and may electrically connect the first electrode branch portion AE2 and the light emitting element ED. The second contact electrode CTE2 may cover the second electrode branch portion CE2 and another part (e.g., a second end portion) of the light emitting element ED, and may electrically connect the second electrode branch portion CE2 and the light emitting element ED.

The first contact electrode CTE1 may be disposed on the first electrode branch portion AE2 and extend in the second direction (Y-axis direction). The first contact electrode CTE1 may be in contact with one end of the light emitting element ED. The light emitting element ED may be electrically connected to the first electrode AE through the first contact electrode CTE1.

The second contact electrode CTE2 may be disposed on the second electrode branch CE2 and extend in the second direction (Y-axis direction). The second contact electrode CTE2 may be spaced from the first contact electrode CTE1 in the first direction (X-axis direction). The second contact electrode CTE2 may be in contact with the other end of the light emitting element ED. The light emitting element ED may be electrically connected to the second electrode CE through the second contact electrode CTE2.

The contact electrode CTE may include a conductive material. For example, the contact electrode CTE may include ITO, IZO, ITZO, or aluminum (Al), but the material thereof is not limited thereto.

Figure 8:
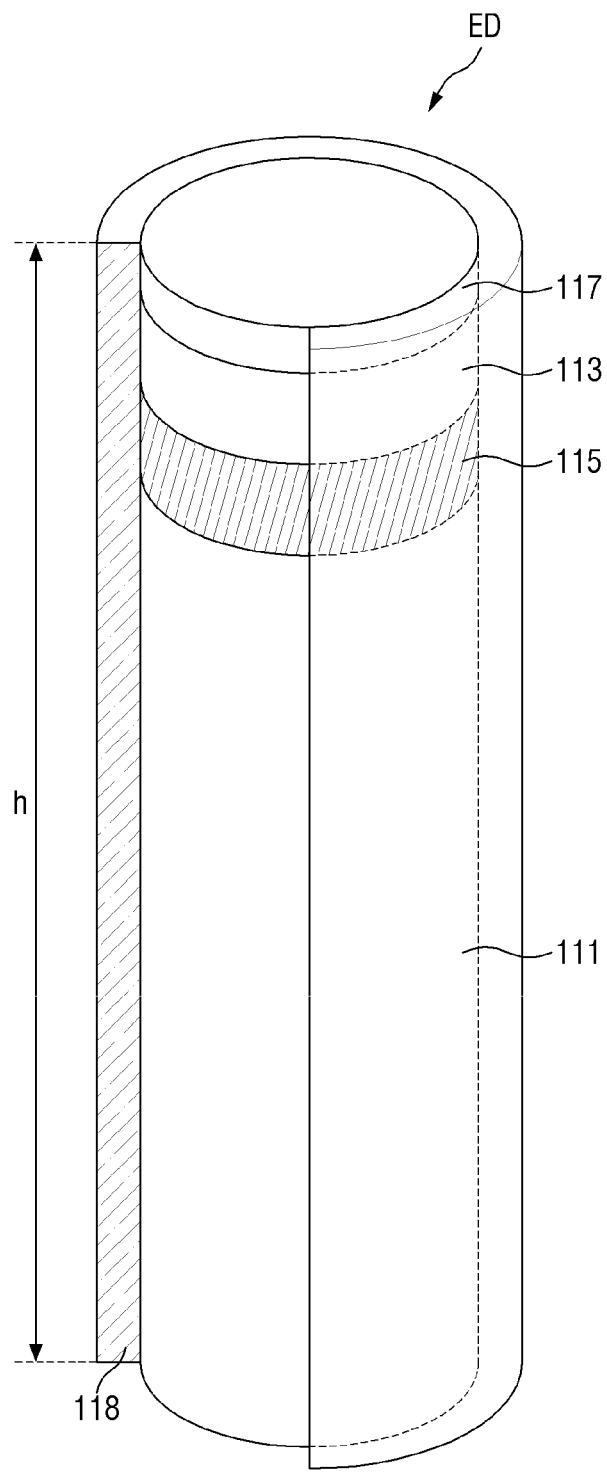
FIG. 8 is a perspective view of a light emitting element according to one or more example embodiments.

FIG. 8 is a perspective view of a light emitting element according to one or more example embodiments.

Referring to FIG. 8, the light emitting element ED may be a light emitting diode. For example, the light emitting element ED may have a size of a micrometer or nanometer, and may be an inorganic light emitting diode including an inorganic material. The inorganic light emitting diode may be aligned between two electrodes according to an electric field formed in a specific direction between the two electrodes facing each other.

The light emitting element ED may have a shape extending in one direction. The light emitting element ED may have a shape of a rod, wire, tube, or the like. For example, the light emitting element ED may have a cylindrical shape or a rod shape. For another example, the light emitting element ED may have a polygonal columnar shape such as a cube, a rectangular parallelepiped, or a hexagonal column, or may have various shapes extending in one direction and partially inclined. The plurality of semiconductor layers of the light emitting element ED may be sequentially arranged or stacked along one direction.

The light emitting element ED may include a first semiconductor layer 111, a second semiconductor layer 113, an active layer 115, an electrode layer 117, and an insulating layer 118.

The first semiconductor layer 111 may include an n-type semiconductor. For example, when the light emitting element ED emits blue light, the first semiconductor layer 111 may include a semiconductor material having the formula $Al_xGa_yIn_{1-x-y}N$ ($0 \leq x \leq 1$, $0 \leq y \leq 1$, $0 \leq x+y \leq 1$). The first semiconductor layer 111 may include at least one semiconductor material from among AlGaInN, GaN, AlGaN, InGaN, AlN, and InN, which are doped with an n-type dopant. The first semiconductor layer 111 may be doped with an n-type dopant such as Si, Ge, or Sn. The first semiconductor layer 111 may include n-GaN doped with Si, which is an n-type dopant. The length of the first semiconductor layer 111 may have a range of 1.5 μm to 5 μm, but is not limited thereto.

The second semiconductor layer 113 may be disposed on the active layer 115. For example, when the light emitting element ED emits blue light or green light, the second semiconductor layer 113 may include a semiconductor material having the formula $Al_xGa_yIn_{1-x-y}N$ ($0 \leq x \leq 1$, $0 \leq y \leq 1$, $0 \leq x+y \leq 1$). The second semiconductor layer 113 may include at least one semiconductor material from among AlGaInN, GaN, AlGaN, InGaN, AlN, and InN, which are doped with a p-type dopant. The second semiconductor layer 113 may be doped with a p-type dopant such as Mg, Zn, Ca, Se, or Ba. The second semiconductor layer 113 may include p-GaN doped with Mg, which is a p-type dopant. The length of the second semiconductor layer 113 may have a range of 0.05 μm to 0.10 μm, but is not limited thereto.

Each of the first and second semiconductor layers 111 and 113 may be formed as one layer, but the present disclosure is not limited thereto. For example, each of the first and second semiconductor layers 111 and 113 may have a plurality of layers by further including a clad layer or a tensile strain barrier reducing (TSBR) layer.

The active layer 115 may be disposed between the first and second semiconductor layers 111 and 113. The active layer 115 may include a material having a single or multiple quantum well structure. When the active layer 115 includes a material having a multiple quantum well structure, a plurality of quantum layers and a plurality of well layers may be alternately stacked. The active layer 115 may emit light by the combination of electron-hole pairs according to electrical signals applied through the first and second semiconductor layers 111 and 113. For example, when the active layer 115 emits blue light, the active layer 115 may include a material such as AlGaN or AlGaInN. When the active layer 115 is a multiple quantum well structure in which quantum layers and well layers are alternately stacked, the quantum layers may include a material such as AlGaN or AlGaInN, and the well layers may include a material such as GaN or AlInN. The active layer 115 may emit blue light using quantum layers containing AlGaInN and well layers containing AlInN.

In another example, the active layer 115 may have a structure in which semiconductor materials having large band gap energy and semiconductor materials having small band gap energy are alternately stacked, and may include group III to group V semiconductor materials according to a wavelength band of emitted light. The light emitted by the active layer 115 is not limited to blue light, and may be red light or green light in some cases. The length of the active layer 115 may have a range of 0.05 μm to 0.10 μm, but is not limited thereto.

The light emitted from the active layer 115 may be emitted in the length direction of the light emitting element ED, and may also be emitted to both sides of the light emitting element ED. The direction of the light emitted from the active layer 115 may not be limited.

The electrode layer 117 may include an ohmic contact electrode. For example, the electrode layer 117 may include a Schottky contact electrode. The light emitting element ED may include at least one electrode layer 117. In the electrode layer 117, when the light emitting element ED is electrically connected to the electrode or the contact electrode CTE, the resistance between the light emitting element ED and the electrode or the contact electrode CTE may be reduced. The electrode layer 117 may include a conductive metal. For example, the electrode layer 117 may include at least one of aluminum (Al), titanium (Ti), indium (In), gold (Au), silver (Ag), indium tin oxide (ITO), indium zinc oxide (IZO), and indium tin-zinc oxide (ITZO). The electrode layer 117 may include a semiconductor material doped with an n-type or a p-type dopant.

The insulating layer 118 may surround the outer surfaces of the plurality of semiconductor layers (e.g., 111 and 113) and the plurality of electrode layers (e.g., 117) of the light emitting element ED. The insulating layer 118 may also surround the outer surface of the active layer 115, and may extend in a direction in which the light emitting element ED may extend. The insulating layer 118 may protect the light emitting element ED. For example, the insulating layer 118 may surround the side surface of the light emitting element ED, and may expose both ends of the light emitting element ED in the length direction.

The insulating layer 118 may include materials having insulating properties, for example, silicon oxide ($SiO_x$), silicon nitride ($SiN_x$), silicon oxynitride ($SiO_xN_y$), aluminum nitride (AlN), and aluminum oxide ($Al_2O_3$). Accordingly, the insulating layer 118 may prevent an electrical short circuit that may occur when the active layer 115 directly contacts an electrode through which an electrical signal is transmitted to the light emitting element ED. Further, the insulating layer 118 may protect the outer surface of the light emitting element ED including the active layer 115, thereby preventing the reduction in light emission efficiency.

The outer surface of the insulating layer 118 may be surface-treated. When manufacturing the display substrate 100, the light emitting elements ED may be aligned by spraying the light emitting elements ED on the electrode in a state in which the light emitting elements ED are dispersed in an ink (e.g., a set ink or a predetermined ink). Because the surface of the insulating layer 118 is hydrophobically or hydrophilically treated, the light-emitting elements ED may maintain a dispersed state without aggregation with other adjacent light-emitting elements ED in the ink.

Figure 9:
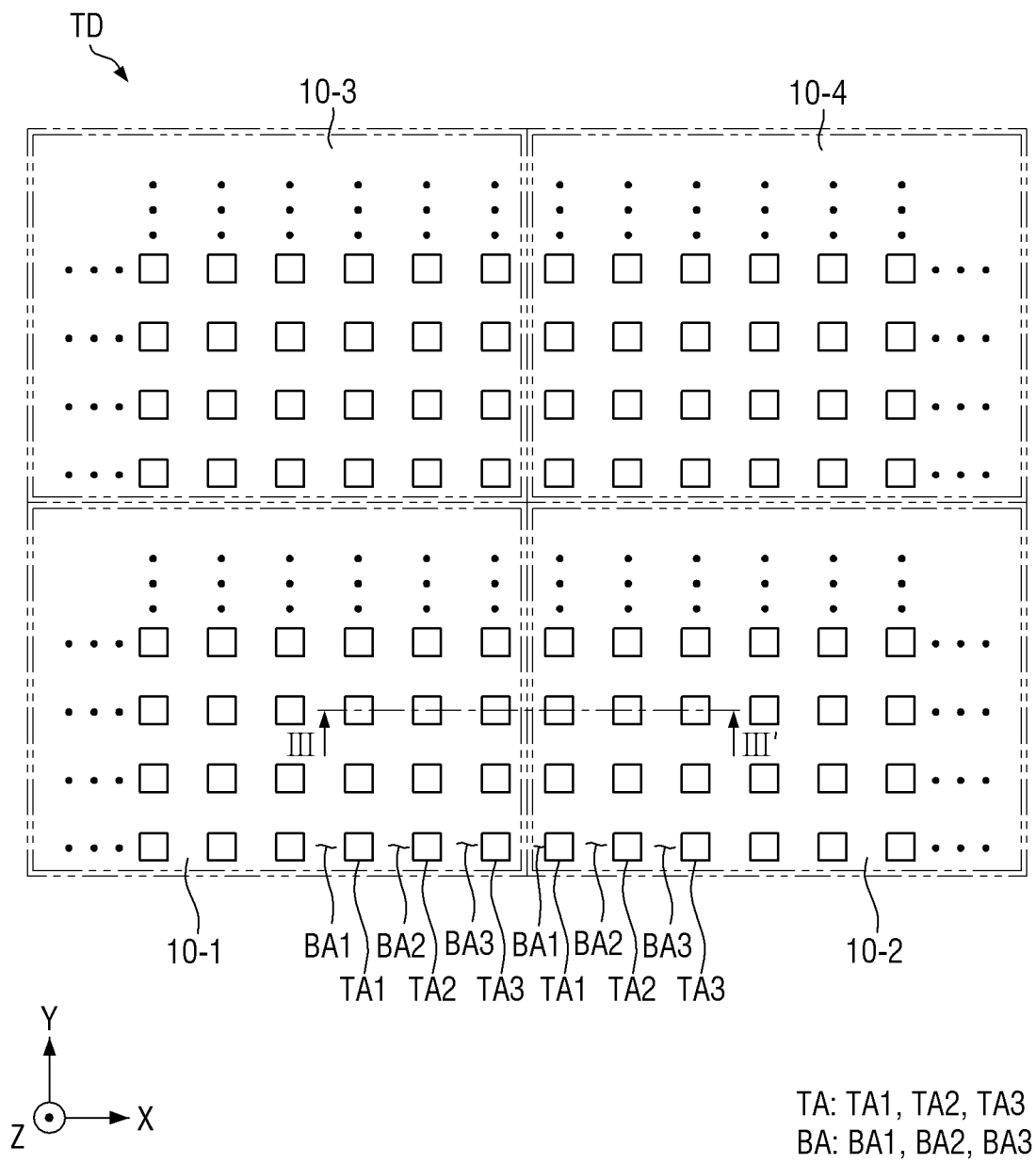
FIG. 9 is a plan view illustrating a coupling structure of a tiled display device according to one or more example embodiments.
Figure 10:
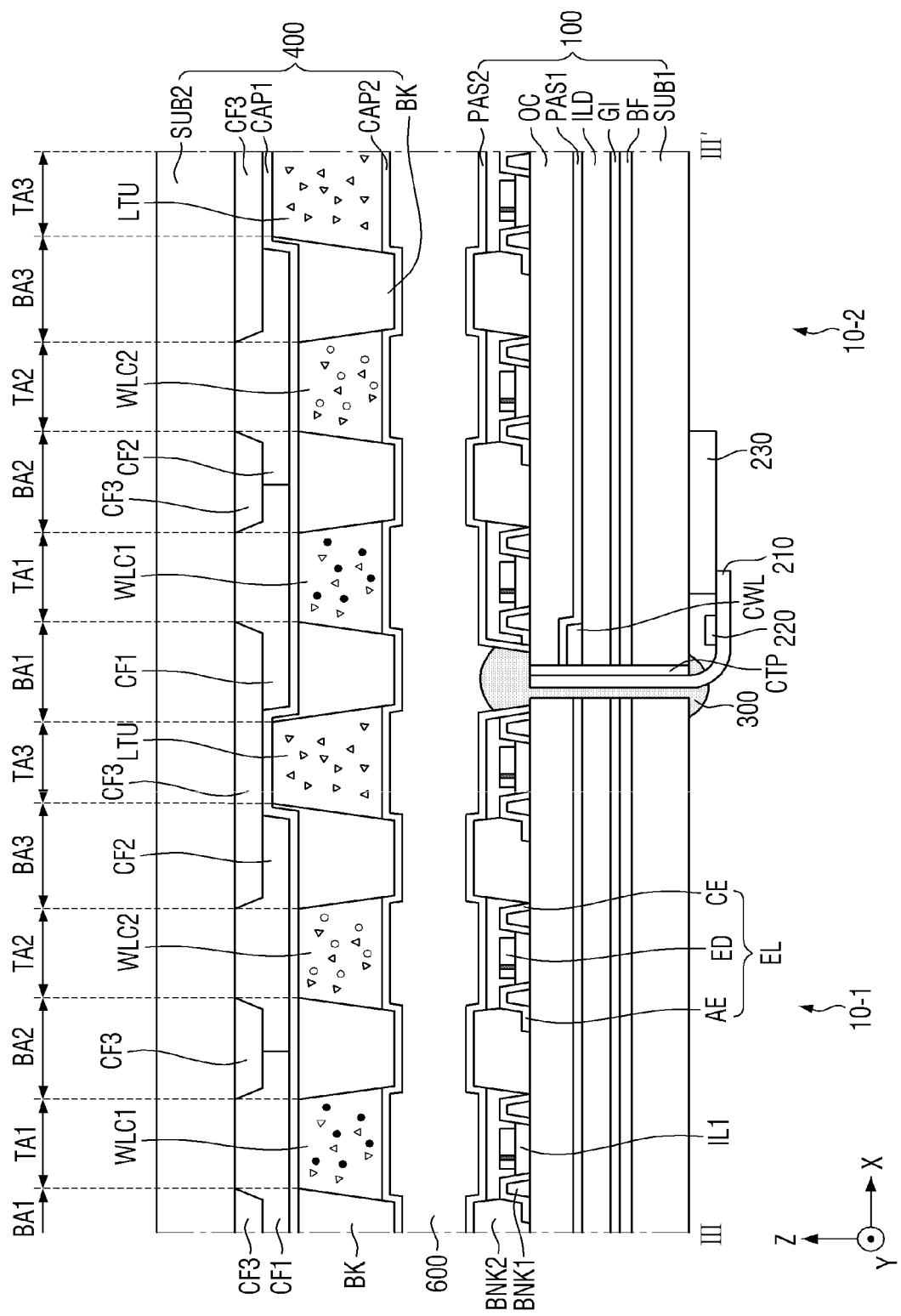
FIG. 10 is a cross-sectional view of a tiled display device according to one or more example embodiments taken along the line III-III' of FIG. 9.

FIG. 9 is a plan view illustrating a coupling structure of a tiled display device according to one or more example embodiments, and FIG. 10 is a cross-sectional view of a tiled display device according to one or more example embodiments taken along the line III-III' of FIG. 9.

Referring to FIGS. 9 and 10, the tiled display device TD may include a plurality of display substrates 100, a coupling member 300, and a color conversion substrate 400. Each of the plurality of display substrates 100 may correspond to each of the plurality of display devices 10. For example, the tiled display device TD may include first to fourth display devices 10-1 to 10-4, but the number of the display substrates 100 or the display devices 10 is not limited to that of the embodiment of FIG. 9. The number of the display substrates 100 or the display devices 10 may be determined according to the size of each of the display device 10 and the tiled display device TD.

In the tiled display device TD, the side surfaces of the adjacent display substrates 100 may be coupled to each other by using the coupling member 300 disposed between the plurality of display substrates 100. The coupling member 300 may implement the tiled display device TD by connecting the side surfaces of first to fourth display devices 10-1 to 10-4 arranged in a grid shape to each other. The coupling member 300 may couple the side surfaces of the second passivation layer PAS2 of each of the display devices 10 adjacent to each other. As shown in FIG. 10, the coupling member may surround the side surface of the second passivation layer PAS2 of the second display device 10-2, the upper, side, and lower surfaces of the connection pad CTP, the upper and side surfaces of the flexible film 210, and the side surface of the display substrate 100 not covered by the connection pad CTP or the flexible film 210.

For example, the coupling member 300 may be formed as an adhesive or double-sided tape having a relatively thin thickness, thereby reducing or minimizing the distance between the plurality of display devices 10. For another example, the coupling member 300 may be formed as a coupling frame having a relatively thin thickness, thereby reducing or minimizing the distance between the plurality of display devices 10 (e.g., 10-1, 10-2, 10-3, 10-4).

The display device 10 may include a connection line CWL disposed on the interlayer insulating film ILD at the outer frame of the display substrate 100. The connection line CWL may be electrically connected to the connection pad CTP disposed on the side surface of the display device 10, and may be connected to a plurality of data lines or a plurality of scan lines. The connection line CWL may be connected to the plurality of data lines to supply a data voltage, and may be connected to the plurality of scan lines to supply a scan signal. For example, the connection line CWL may be formed of the same material at the same layer as the source electrode SE or the drain electrode DE of the thin film transistor TFT, but the present disclosure is not limited thereto. For example, the connection line CWL may be formed of the same material at the same layer as the gate electrode GE of the thin film transistor TFT.

One of the first and second display devices 10-1 and 10-2 may include the connection pad CTP and the flexible film 210 disposed between the first and second display devices 10-1 and 10-2. For example, when the connection pad CTP and the flexible film 210 are disposed at the left side of the display device 10 (e.g., 10-2), the second display devices 10-2 may include the connection pad CTP and the flexible film 210 disposed between the first and second display devices 10-1 and 10-2.

The connection pad CTP may be disposed on at least one side surface of the display device 10. For example, the connection pad CTP may extend from the side surface of the first base member SUB1 of the display substrate 100 to the side surface of the planarization layer OC. The connection pad CTP may receive various voltages or signals from the plurality of flexible films 210, and may supply the voltages or signals to the connection lines CWL.

The display device 10 may further include an adhesive film that attaches the plurality of flexible films 210 to the connection pad CTP. The adhesive film may attach the plurality of flexible films 210 to one surface of the connection pad CTP. One surface of the adhesive film may be attached to one surface of the connection pad CTP, and the other surface of the adhesive film may be attached to one surface of the plurality of flexible films 210. For example, the adhesive film may cover the entire connection pad CTP, but the present disclosure is not limited thereto. For another example, the adhesive film may cover a part of the connection pad CTP and expose the other part thereof.

For example, the adhesive film may include an anisotropic conductive film. When the adhesive film includes an anisotropic conductive film, the adhesive film may have conductivity in an area in which the connection pads CTP are in contact with the contact pads of the plurality of flexible films 210, and may electrically connect the plurality of flexible films 210 to the connection pads CTP.

Optionally, the adhesive film may be omitted. In such a case, the plurality of flexible films 210 may be in direct contact with the connection pad CTP. For example, the contact pads of the plurality of flexible films 210 may be connected to the connection pad CTP by a method such as ultrasonic bonding or welding.

Each of the plurality of flexible films 210 may be disposed on one side of the display substrate 100. The flexible film 210 may extend from the side surface of the display substrate 100 to the lower surface of the display substrate 100. For example, the flexible film 210 may be disposed on the side surface of the display substrate 100 through side bonding. One side of the flexible film 210 may be connected to the connection line CWL of the display substrate 100 on the side surface of the display substrate 100, and the other side of the flexible film 210 may be connected to the source circuit board 230 on the lower surface of the display substrate 100. For example, the flexible film 210 may be an anisotropic conductive film, and may transmit a signal from the source driver 220 or the source circuit board 230 to the display substrate 100.

The connection pad CTP and the flexible film 210 disposed between the first and second display devices 10-1 and 10-2 may overlap the light blocking area BA of the color conversion substrate 400 in the thickness direction. Hereinafter, the thickness direction refers to the third direction or the Z-axis direction. For example, when the connection pad CTP and the flexible film 210 are disposed at the left side of the display device 10 (e.g., 10-2), the connection pad CTP and the flexible film 210 of the second display device 10-2 may overlap the light blocking area BA of the color conversion substrate 400 in the thickness direction.

The color conversion substrate 400 may include a light blocking area BA overlapping the connection pad CTP and the flexible film 210 disposed between the plurality of display substrates 100, and a plurality of light transmitting areas TA adjacent to both sides of the corresponding light blocking area BA. As shown in FIG. 10, the light emitting area LA disposed on the outermost right side of the first display device 10-1 may overlap the third light transmitting area TA3 of the color conversion substrate 400, and the light emitting area LA disposed on the outermost left side of the second display device 10-2 may overlap the first light transmitting area TA1 of the color conversion substrate 400. The first light blocking area BA1 may be disposed between the third light transmitting area TA3 and the first light transmitting area TA1 of the color conversion substrate 400, and may overlap the connection pad CTP and the flexible film 210 disposed between the first and second display devices 10-1 and 10-2 in the thickness direction. Accordingly, the light blocking area BA corresponding to the area between the first and second display devices 10-1 and 10-2 may prevent the boundary portion or the non-display area NDA between the first and second display devices 10-1 and 10-2 from being visually recognized, and may remove the appearance of disconnection between the plurality of display devices 10 and improve the degree of immersion into an image.

For example, the external light reflectance of the light blocking area BA overlapping the plurality of display devices 10 may be substantially the same as the external light reflectivity of the light blocking area BA overlapping the connection pad CTP or the flexible film 210 disposed between the plurality of display devices 10. The light blocking area BA disposed between the plurality of display devices 10 may prevent or substantially prevent a user from recognizing the non-display area NDA or the boundary portion between the plurality of display devices 10. Therefore, in the tiled display device TD, it is possible to prevent the non-display area NDA or the boundary portion between the plurality of display devices 10 from being recognized.

Figure 11:
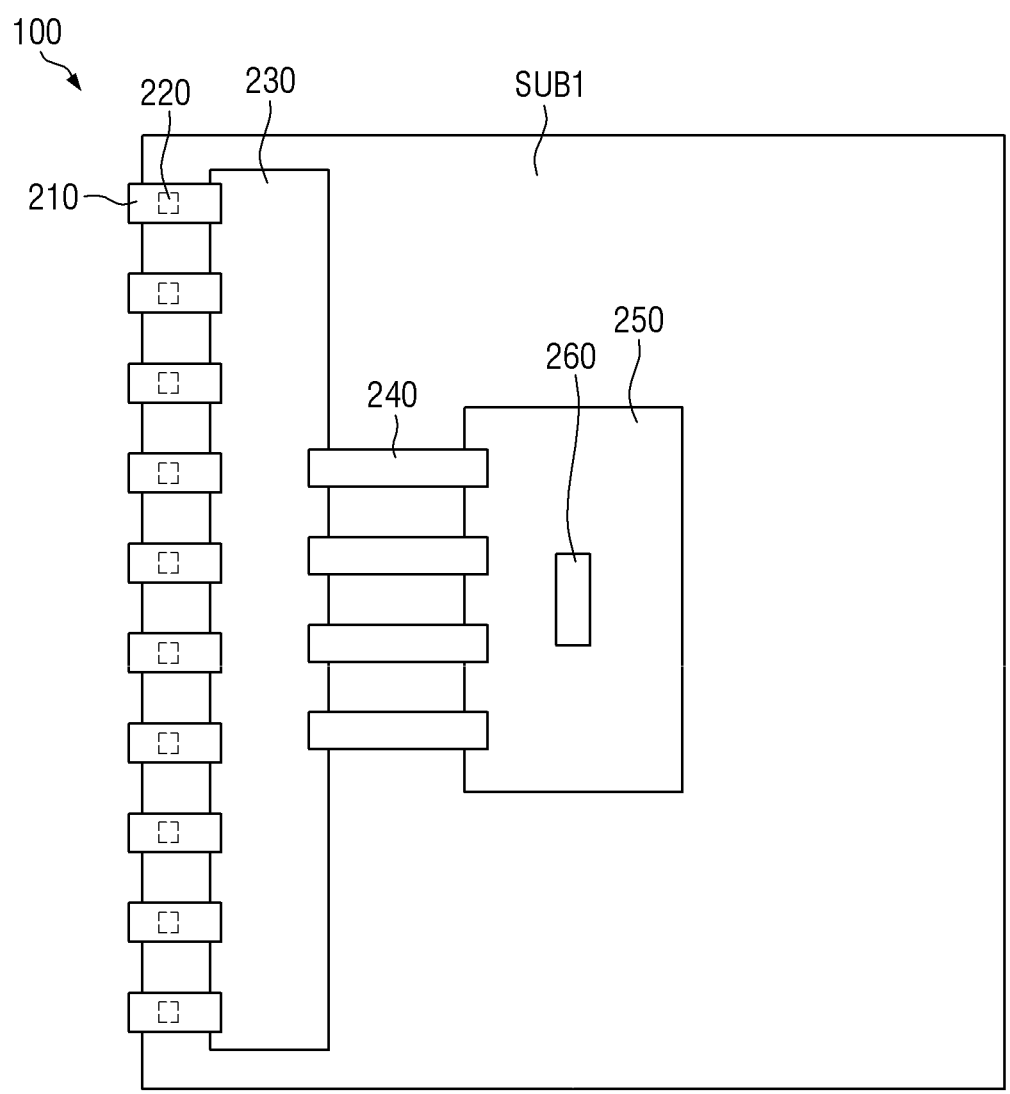
FIG. 11 is a plan view illustrating a rear surface of a display substrate of a display device according to one or more example embodiments.

FIG. 11 is a plan view illustrating a rear surface of a display substrate of a display device according to one or more example embodiments.

Referring to FIG. 11, the display substrate 100 may include a first base member SUB1. The first base member SUB1 may be a base substrate, and may be made of an insulating material such as a polymer resin. For example, the first base member SUB1 may be a rigid substrate. When the first base member SUB1 is a rigid substrate, the first base member SUB1 may include a glass material or a metal material, but the material thereof is not limited thereto. In another example, the first base member SUB1 may be a flexible substrate capable of bending, folding, rolling, or the like. When the first base member SUB1 is a flexible substrate, the first base member SUB1 may include polyimide PI, but the material thereof is not limited thereto.

The display substrate 100 of each of the plurality of display devices 10 includes a plurality of flexible films 210, a plurality of source drivers 220, a source circuit board 230, a plurality of cables 240, a control circuit board 250, and a timing controller 260.

Each of the plurality of flexible films 210 may be disposed at one side of the display substrate 100. The flexible film 210 may extend from the side surface of the display substrate 100 to the lower surface of the display substrate 100. For example, the flexible film 210 may be disposed on the side surfaces of the display substrate 100 and the color conversion substrate 400 through side bonding. One side of the flexible film 210 may be connected to the connection line CWL of the display substrate 100 on the side surface of the display substrate 100, and the other side of the flexible film 210 may be connected to the source circuit board 230 on the lower surface of the display substrate 100. For example, the flexible film 210 may be an anisotropic conductive film, and may transmit a signal from the source driver 220 or the source circuit board 230 to the display substrate 100.

Each of the plurality of source drivers 220 may be disposed on one surface of each of the plurality of flexible films 210. For example, the source driver 220 may be an integrated circuit (IC). The source driver 220 may convert digital video data into an analog data voltage based on a source control signal of the timing controller 260, and may supply the analog data voltage to the data line of the display substrate 100 through the flexible film 210.

The source circuit board 230 may be disposed between the plurality of flexible films 210 and the plurality of cables 240. The source circuit board 230 may be connected to the plurality of source drivers 220 or the display substrate 100 through the plurality of flexible films 210, and may be connected to the control circuit board 250 or the timing controller 260 through the plurality of cables 240. For example, the source circuit board 230 may be a flexible printed circuit board or a printed circuit board. The plurality of cables 240 may be flexible cables, but are not limited thereto.

The control circuit board 250 may be connected to the source circuit board 230 through the cable 240. For example, the control circuit board 250 may be a flexible printed circuit board (FPCB) or a printed circuit board (PCB).

The timing controller 260 may be disposed on one surface of the control circuit board 250. For example, the timing controller 260 may be an integrated circuit. The timing controller 260 may receive digital video data and timing signals from a system on chip of a system circuit board. The timing controller 260 may generate a source control signal based on the timing signals to control the driving timing of the plurality of source drivers 220. The timing controller 260 may generate a scan control signal based on the timing signals to control the driving timing of the scan driver.

The display device 10 may further include a power supply unit disposed on the control circuit board 250. The power supply unit may generate voltages required for driving the display substrate 100 from a main power applied from the system circuit board and supply the voltages to the display substrate 100. For example, the power supply unit may generate driving voltages that drive the plurality of source drivers 220, the timing controller 260, and the scan driver.

Figure 12:
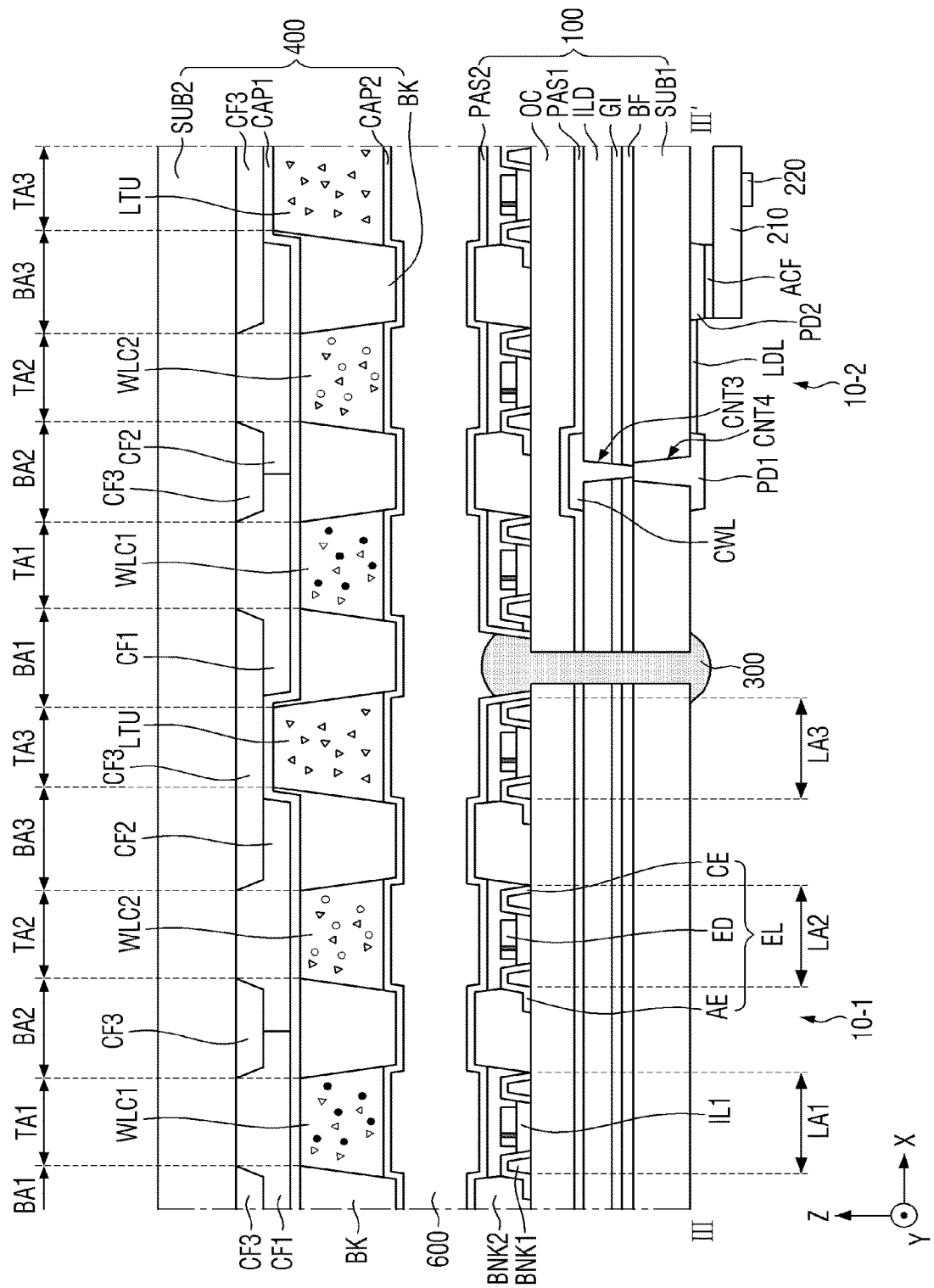
FIG. 12 is a cross-sectional view of a tiled display device according to another example embodiment taken along the line III-III' of FIG. 9.
Figure 13:
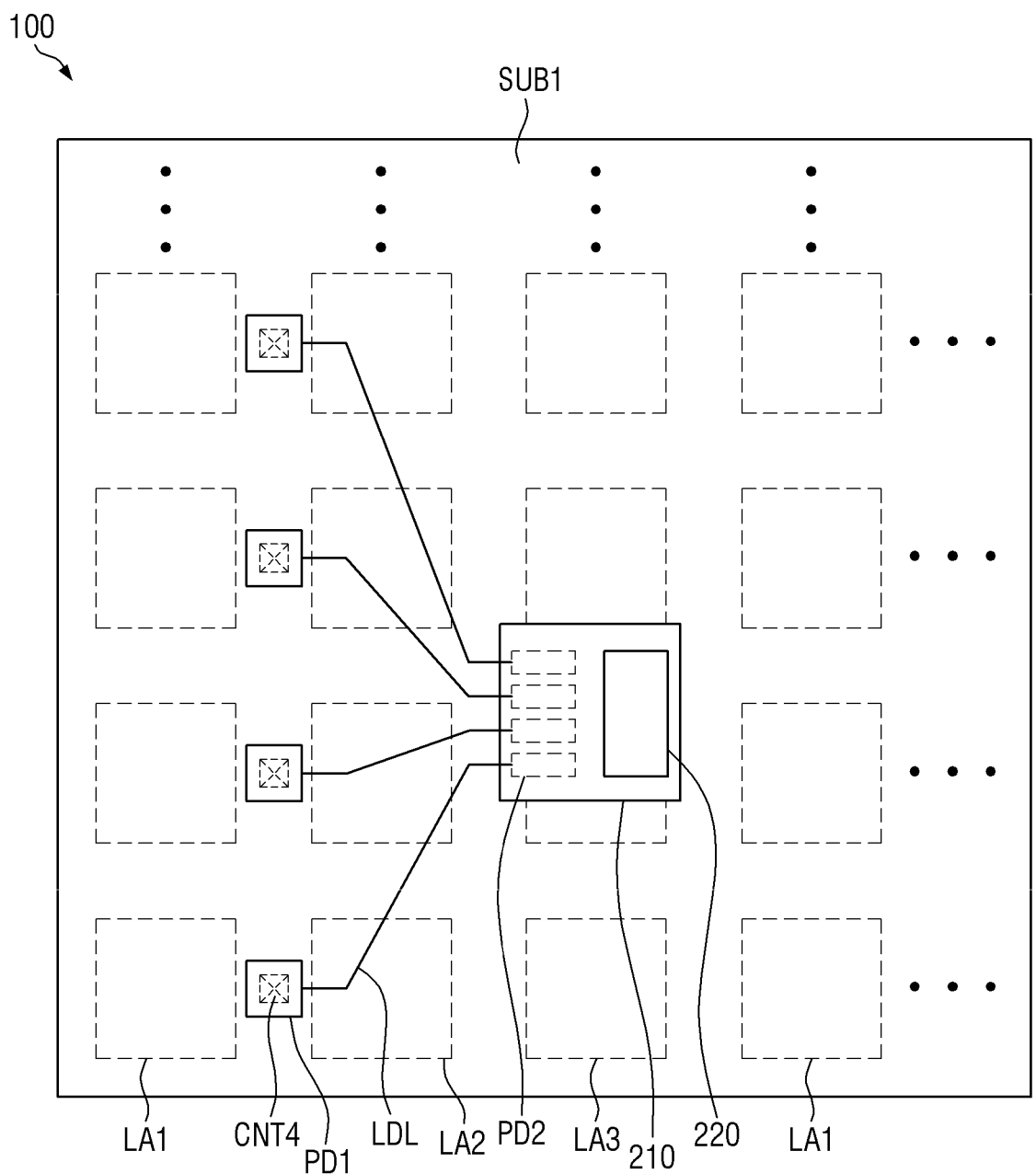
FIG. 13 is a plan view illustrating a rear surface of a display substrate of a display device according to another example embodiment.

FIG. 12 is a cross-sectional view of a tiled display device according to another embodiment taken along the line III-III' of FIG. 9, and FIG. 13 is a plan view illustrating a rear surface of a display substrate of a display device according to another embodiment. The display device shown in FIG. 12 is different from the display device shown in FIG. 10 in the connection relationship between the connection line CWL and the flexible film 210. The same components as the above-described components will be briefly described or omitted.

Referring to FIGS. 12 and 13, the coupling member 300 is disposed between the plurality of display substrates 100 to couple the side surfaces of the adjacent display substrates to each other. The coupling member 300 may implement the tiled display device TD by connecting the side surfaces of the plurality of display devices 10 (e.g., 10-1, 10-2) arranged in a grid shape to each other. The coupling member 300 may couple the side surfaces of the second passivation layer PAS2 of the display devices 10 (e.g., 10-1, 10-2) adjacent to each other. As shown in FIG. 12, the coupling member 300 may couple the side surfaces of the second passivation layer PAS2 of each of the display devices 10 adjacent to each other, and may couple the side surfaces of the display substrate 100 of each of the display devices 10 adjacent to each other.

For example, the coupling member 300 may be formed as an adhesive or double-sided tape having a relatively thin thickness, thereby reducing or minimizing the distance between the plurality of display devices 10. For another example, the coupling member 300 may be formed as a coupling frame having a relatively thin thickness, thereby reducing or minimizing the distance between the plurality of display devices 10 (e.g., 10-1, 10-2).

The display substrate 100 may include a connection line CWL disposed on the interlayer insulating film ILD in the display area DA. The connection line CWL may be connected to the first pad unit PD1 through a third contact hole CNT3 passing through the interlayer insulating film ILD, the gate insulating film GI, and the buffer layer BF. The connection line CWL may be connected to a plurality of data lines or a plurality of scan lines. The connection line CWL may be connected to the plurality of data lines to supply data voltages, and may be connected to the plurality of scan lines to supply scan signals. For example, the connection line CWL may be formed of the same material at the same layer as the source electrode SE or the drain electrode DE of the thin film transistor TFT, but the present disclosure is not limited thereto. In another example, the connection line CWL may be formed of the same material at the same layer as the gate electrode GE of the thin film transistor TFT.

The connection line CWL may be disposed between the plurality of light emitting areas LA. The connection line CWL may overlap the light blocking area BA of the color conversion substrate 400 in the thickness direction. As shown in FIG. 12, the connection line CWL may overlap the second bank BNK2, the light blocking member BK corresponding to the second bank BNK2, and the second light blocking area BA2 in the thickness direction. The connection line CWL is disposed between the plurality of light emitting areas LA of the display area DA, so that the display substrate 100 may not include a separate pad unit disposed at the outermost side thereof, and the bezel area or dead space of the display substrate 100 may be reduced or minimized. Accordingly, the connection line CWL is disposed in the display area DA and the flexible film 210 is disposed on the lower surface of the display substrate 100, so that the distance between the plurality of display devices 10 may further be reduced compared to when the pad unit is disposed on the outermost side of the display substrate or when the flexible film is disposed on the side surface of the display substrate (e.g., as shown in FIG. 10).

The first pad unit PD1 may be disposed on the lower surface of the display substrate 100. The first pad unit PD1 may be connected to the connection line CWL through the fourth contact hole CNT4 passing through the first base member SUB1. As shown in FIG. 12, the first pad unit PD1 may overlap the connection line CWL, the second bank BNK2 corresponding to the connection line CWL, the light blocking member BK corresponding to the second bank BNK2, and the second light blocking area BA in the thickness direction. The third contact hole CNT3 through which the connection line CWL passes and the fourth contact hole CNT4 through which the first pad unit PD1 passes may be connected to each other.

The second pad unit PD2 may be disposed on the lower surface of the display substrate 100, and may be spaced from the first pad unit PD1. The second pad unit PD2 may be connected to the first pad unit PD1 through a lead line LDL. The second pad unit PD2 may receive various voltages or signals from the flexible film 210 and may supply the voltage or signals to the first pad unit PD1 and the connection line CWL.

An adhesive film ACF may attach the flexible film 210 to the second pad unit PD2. One surface of the adhesive film ACF may be attached to the second pad unit PD2, and the other surface of the adhesive film ACF may be attached to the flexible film 210. For example, the connection film ACF may cover the entire second pad unit PD2, but the present disclosure is not limited thereto.

The adhesive film ACF may include an anisotropic conductive film. When the adhesive film (or connection film) ACF includes an anisotropic conductive film, the adhesive film ACF may have conductivity in an area where the second pad unit PD2 is in contact with the contact pad of the flexible film 210, and may electrically connect the flexible film 210 to the second pad unit PD2.

The flexible film 210 may be disposed on the lower surface of the display substrate 100. One side of the flexible film 210 may be connected to the second pad unit PD2 via the adhesive film ACF, and the other side of the flexible film 210 may be connected to the source driver 220 on the lower surface of the display substrate 100. For example, the flexible film 210 may transmit a signal from the source driver 220 or the source circuit board 230 to the display substrate 100.

The color conversion substrate 400 may include a light blocking area BA overlapping the coupling member 300 disposed between the plurality of display substrates 100, and a plurality of light transmitting areas TA adjacent to both sides of the corresponding light blocking area BA. As shown in FIG. 12, the light emitting area LA disposed on the outermost right side of the first display device 10-1 may overlap the third light transmitting area TA3 of the color conversion substrate 400, and the light emitting area LA disposed on the outermost left side of the second display device 10-2 may overlap the first light transmitting area TA1 of the color conversion substrate 400. The first light blocking area BA1 may be disposed between the third light transmitting area TA3 and the first light transmitting area TA1 of the color conversion substrate 400, and may overlap the coupling member 300 disposed between the first and second display devices 10-1 and 10-2 in the thickness direction. Accordingly, the light blocking area BA corresponding to the area between the first and second display devices 10-1 and 10-2 may prevent the boundary portion or the non-display area NDA between the first and second display devices 10-1 and 10-2 from being visually recognized, and may remove the appearance of disconnection between the plurality of display devices 10 and improve the degree of immersion into an image.

Figure 14:
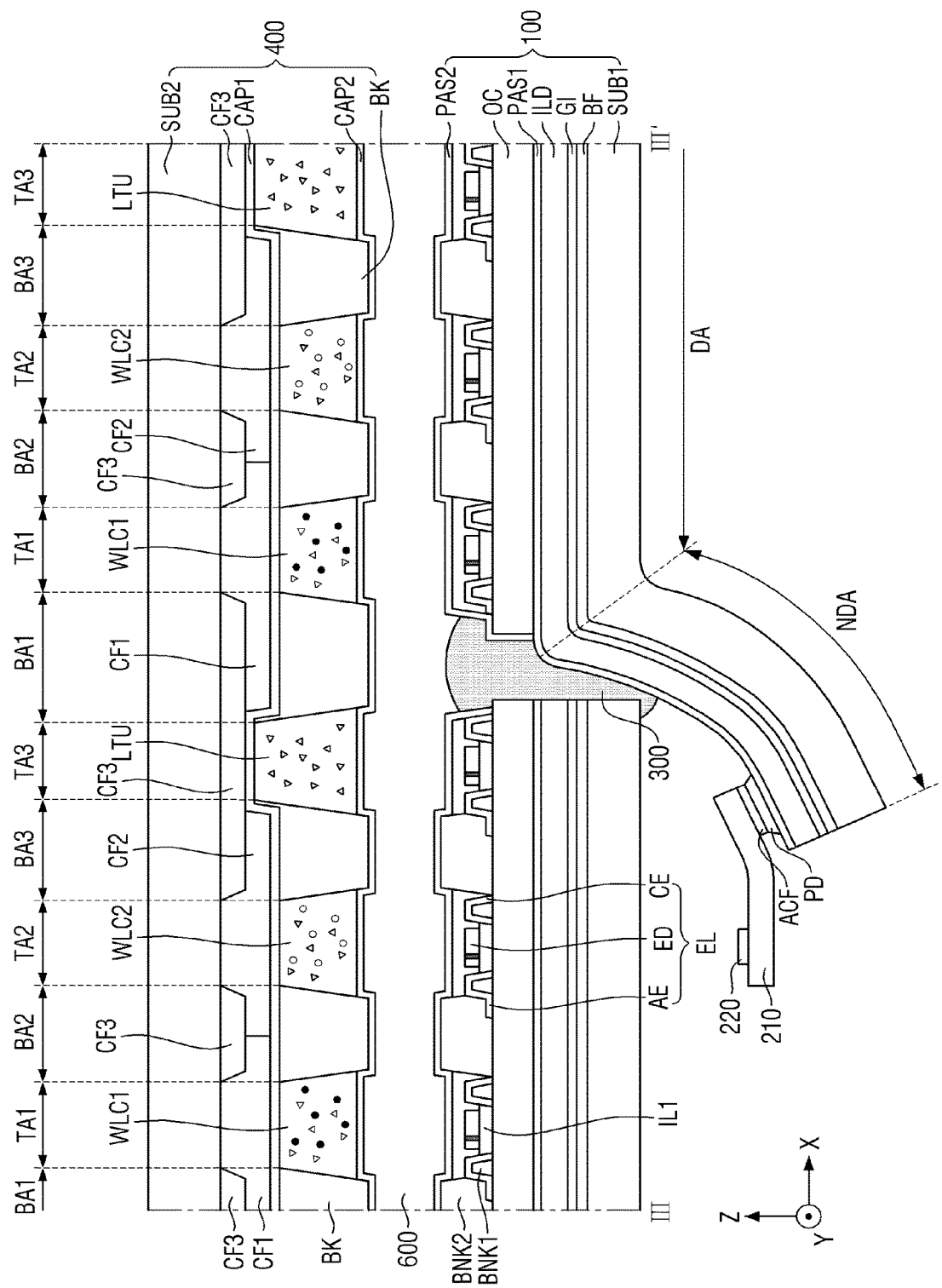
FIG. 14 is a cross-sectional view of a tiled display device according to another example embodiment taken along the line III-III' of FIG. 9.

FIG. 14 is a cross-sectional view of a tiled display device according to another example embodiment taken along the line III-III' of FIG. 9. The display device shown in FIG. 14 is different from the display device shown in FIGS. 10 and 12 in the connection relationship between the display substrate 100 and the flexible film 210. The same components as the above-described components may be briefly described or omitted.

Referring to FIG. 14, the coupling member 300 is disposed between the plurality of display substrates 100 to couple the side surfaces of the adjacent display substrates to each other. The coupling member 300 may implement the tiled display device TD by connecting the side surfaces of the plurality of display devices 10 arranged in a grid shape to each other. The coupling member 300 may couple the side surfaces of the second passivation layer PAS2 of each of the display devices 10 adjacent to each other. As shown in FIG. 14, the coupling member 300 may couple the side surfaces of the second passivation layer PAS2 of each of the display devices 10-1 and 10-2 adjacent to each other, and may couple the side surface of the display substrate 100 of the first display device 10-1, the side surface of the display area DA of the second display device 10-2, and the upper surface of the non-display area NDA of the second display device 10-2.

For example, the coupling member 300 may be formed as an adhesive or double-sided tape having a relatively thin thickness, thereby reducing or minimizing the distance between the plurality of display devices 10. In another example, the coupling member 300 may be formed as a coupling frame having a relatively thin thickness, thereby reducing or minimizing the distance between the plurality of display devices 10.

The display area DA of each of the plurality of display substrates 100 may be disposed on a virtual coplanar surface, and the non-display area NDA in which the pad unit PD is disposed may extend from the display area DA of the corresponding display substrate 100 to the lower portion of another adjacent display substrate 100. The pad unit PD, the adhesive film ACF, the flexible film 210, and the source driver 220 of the display substrate 100 may overlap the display area DA of another adjacent display substrate 100 in the thickness direction. Accordingly, the distance between the display areas DA of each of the plurality of display substrates 100 may be further reduced.

The pad unit PD may be disposed in the non-display area NDA of the corresponding display substrate 100, and may overlap the display area DA of another adjacent display substrate 100 in the thickness direction. The pad unit PD may receive various voltages or signals from the flexible film 210 and supply the voltages or signals to the display substrate 100.

The adhesive film ACF may attach the flexible film 210 to the pad unit PD. One surface of the adhesive film ACF may be attached to the pad unit PD, and the other surface of the adhesive film ACF may be attached to the flexible film 210. For example, the adhesive film ACF may cover the entire pad unit PD, but the present disclosure is not limited thereto.

The adhesive film ACF may include an anisotropic conductive film. When the adhesive film ACF includes an anisotropic conductive film, the adhesive film ACF may have conductivity in an area where the pad unit PD is in contact with the contact pad of the flexible film 210, and may electrically connect the flexible film 210 to the pad unit PD.

The flexible film 210 may overlap the display area DA of another adjacent display substrate 100 in the thickness direction. One side of the flexible film 210 may be connected to the pad unit PD of the corresponding display substrate 100, and the other side of the flexible film 210 may be connected to the source driver 220 on the lower surface of another adjacent display substrate 100. For example, the flexible film 210 may transmit a signal from the source driver 220 or the source circuit board 230 to the display substrate 100.

The color conversion substrate 400 may include a light blocking area BA overlapping the coupling member 300 disposed between the plurality of display substrates 100, and a plurality of light transmitting areas TA adjacent to both sides of the corresponding light blocking area BA. As shown in FIG. 14, the light emitting area LA disposed on the outermost right side of the first display device 10-1 may overlap the third light transmitting area TA3 of the color conversion substrate 400, and the light emitting area LA disposed on the outermost left side of the second display device 10-2 may overlap the first light transmitting area TA1 of the color conversion substrate 400. The first light blocking area BA1 may be disposed between the third light transmitting area TA3 and the first light transmitting area TA1 of the color conversion substrate 400, and may overlap the coupling member 300 disposed between the first and second display devices 10-1 and 10-2 in the thickness direction. Accordingly, the light blocking area BA corresponding to the area between the first and second display devices 10-1 and 10-2 may prevent the boundary portion or the non-display area NDA between the first and second display devices 10-1 and 10-2 from being visually recognized, and may remove the appearance of disconnection between the plurality of display devices 10 and improve the degree of immersion into an image.

Although the one or more example embodiments of the present disclosure have been disclosed for illustrative purposes, those skilled in the art will appreciate that various modifications, additions and substitutions are possible, without departing from the scope and spirit of the disclosure as disclosed in the accompanying claims, and their equivalents.

What is claimed is:

1. A tiled display device, comprising:
a first display substrate comprising a plurality of light emitting areas having a plurality of micro light emitting diodes;
a second display substrate adjacent to the first display substrate and comprising a plurality of light emitting areas having a plurality of micro light emitting diodes;
a coupling member coupling the first display substrate and the second display substrate; and
a color conversion substrate comprising a plurality of light transmitting areas corresponding to the plurality of light emitting areas of each of the first display substrate and the second display substrate, and a plurality of light blocking areas between the plurality of light transmitting areas, the plurality of light blocking areas overlapping the coupling member in a thickness direction of the first and the second display substrates,
wherein the first display substrate comprises a connection pad on a side surface of the first display substrate between the first display substrate and the second display substrate, and
wherein the connection pad overlaps one of the plurality of light blocking areas in the thickness direction.

2. The tiled display device of claim 1, wherein the plurality of micro light emitting diodes of at least one of the first display substrate or the second display substrate has a peak wavelength ranging from 440 nm to 480 nm.

3. The tiled display device of claim 1, wherein the first display substrate further comprises a flexible film on one surface of the connection pad and extending from the side surface of the first display substrate to a lower surface of the first display substrate.

4. The tiled display device of claim 3, wherein the flexible film overlaps one of the plurality of light blocking areas in the thickness direction.

5. The tiled display device of claim 3, wherein the first display substrate further comprises a thin film transistor and a connection line located at a same layer as at least one of a drain electrode, a source electrode, or a gate electrode of the thin film transistor, and
wherein the connection line is electrically connected to the flexible film through the connection pad.

6. The tiled display device of claim 1, wherein each of the first display substrate and the second display substrate further comprises:
- a thin film transistor layer comprising at least one thin film transistor;
- a first electrode overlapping one of the plurality of light emitting areas on the thin film transistor layer; and
- a second electrode overlapping one of the plurality of light emitting areas on the thin film transistor layer and spaced from the first electrode,
- wherein the plurality of micro light emitting diodes is located between the first electrode and the second electrode to emit light.

7. The tiled display device of claim 1, wherein the color conversion substrate comprises:
- a base member comprising the plurality of light transmitting areas and the plurality of light blocking areas;
- a plurality of wavelength conversion units on the base member to correspond to one or more of the plurality of light transmitting areas; and
- a light transmission unit on the base member to correspond to other ones of the plurality of light transmitting areas.

8. The tiled display device of claim 7, wherein the plurality of wavelength conversion units comprises:
- a first wavelength conversion unit comprising a first wavelength shifter to convert a peak wavelength of incident light to a first peak wavelength, and a light scattering material; and
- a second wavelength conversion unit comprising a second wavelength shifter to convert a peak wavelength of incident light to a second peak wavelength different from the first peak wavelength, and a light scattering material,
- wherein the light transmission unit is configured to maintain a peak wavelength of incident light using a light scattering material to transmit the incident light.

9. A tiled display device, comprising:
- a first display substrate comprising a plurality of light emitting areas having a plurality of micro light emitting diodes;
- a second display substrate adjacent to the first display substrate and comprising a plurality of light emitting areas having a plurality of micro light emitting diodes;
- a coupling member coupling the first display substrate and the second display substrate; and
- a color conversion substrate comprising a plurality of light transmitting areas corresponding to the plurality of light emitting areas of each of the first display substrate and the second display substrate, and a plurality of light blocking areas between the plurality of light transmitting areas, the plurality of light blocking areas overlapping the coupling member in a thickness direction of the first and the second display substrates,
- wherein the first display substrate comprises:
- a first base member;
- a thin film transistor layer on the first base member and comprising a thin film transistor;
- a connection line between the plurality of light emitting areas in the thin film transistor layer; and
- a pad unit on a lower surface of the first base member and connected to the connection line through a contact hole penetrating the first base member.

10. The tiled display device of claim 9, wherein the first display substrate further comprises a flexible film electrically connected to the pad unit and overlapping the plurality of light emitting areas.

11. The tiled display device of claim 9, wherein the connection line comprises a same material at a same layer as at least one of a drain electrode, a source electrode, or a gate electrode of the thin film transistor.

12. The tiled display device of claim 9, wherein the connection line is connected to the pad unit through a contact hole penetrating at least a part of the thin film transistor layer.

13. The tiled display device of claim 9, wherein the connection line overlaps at least one of the plurality of light blocking areas in the thickness direction.

14. The tiled display device of claim 9, wherein the pad unit overlaps the connection line, and at least one of the plurality of light blocking areas corresponding to the connection line in the thickness direction.

15. A tiled display device, comprising:
- a first display substrate comprising a plurality of light emitting areas having a plurality of micro light emitting diodes;
- a second display substrate adjacent to the first display substrate and comprising a plurality of light emitting areas having a plurality of micro light emitting diodes;
- a coupling member coupling the first display substrate and the second display substrate; and
- a color conversion substrate comprising a plurality of light transmitting areas corresponding to the plurality of light emitting areas of each of the first display substrate and the second display substrate, and a plurality of light blocking areas between the plurality of light transmitting areas, the plurality of light blocking areas overlapping the coupling member in a thickness direction of the first and the second display substrates,
- wherein the first display substrate comprises:
- a display area comprising the plurality of light emitting areas;
- a non-display area surrounding the display area; and
- a pad unit at one side of the non-display area,
- wherein the pad unit overlaps at least one of the plurality of light emitting areas of the second display substrate.

16. The tiled display device of claim 15, wherein the first display substrate further comprises:
- a flexible film connected to the pad unit through an adhesive film; and
- a source driver located on the flexible film,
- wherein the flexible film and the source driver overlap the at least one of the plurality of light emitting areas of the second display substrate.

17. The tiled display device of claim 15,
wherein the first display substrate is a flexible substrate, the non-display area in which the pad unit is located extends from one side of the display area of the first display substrate to a lower portion of the second display substrate.

18. The tiled display device of claim 17,
wherein the coupling member couples an upper surface of the non-display area of the first display substrate and a side surface of the second display substrate.

* * * * *